United States Patent
Feng et al.

(10) Patent No.: US 10,508,233 B1
(45) Date of Patent: *Dec. 17, 2019

(54) MIXED COMPOUND ORGANIC GLASS SCINTILLATORS

(71) Applicant: National Technology & Engineering Solutions of Sandia, LLC, Albuquerque, NM (US)

(72) Inventors: Patrick L. Feng, Livermore, CA (US); Joseph Carlson, Morgan Hill, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 306 days.

This patent is subject to a terminal disclaimer.

(21) Appl. No.: 15/629,954

(22) Filed: Jun. 22, 2017

(51) Int. Cl.
| | |
|---|---|
| *C09K 11/06* | (2006.01) |
| *H01L 51/00* | (2006.01) |
| *H01L 51/50* | (2006.01) |
| *G01T 1/20* | (2006.01) |

(52) U.S. Cl.
CPC ............ *C09K 11/06* (2013.01); *G01T 1/20* (2013.01); *H01L 51/0058* (2013.01); *H01L 51/0094* (2013.01); *H01L 51/5036* (2013.01); *C09K 2211/1011* (2013.01)

(58) Field of Classification Search
CPC .... G01T 1/20; C09K 11/06; C09K 2211/1011
See application file for complete search history.

(56) References Cited

U.S. PATENT DOCUMENTS

| | | | |
|---|---|---|---|
| 7,064,228 B1 | 6/2006 | Yu et al. | |
| 8,698,086 B2 | 4/2014 | Cherepy et al. | |
| 9,845,334 B1* | 12/2017 | Feng ................. | C07F 9/5325 |
| 2013/0299702 A1 | 11/2013 | Zaitseva et al. | |
| 2014/0166889 A1 | 6/2014 | Kang et al. | |
| 2015/0053894 A1* | 2/2015 | Molaire .............. | H01L 51/0053 252/500 |
| 2015/0275076 A1* | 10/2015 | Molaire .................. | C09K 11/06 252/500 |
| 2015/0323683 A1 | 11/2015 | Vasilyev et al. | |
| 2016/0104843 A1 | 4/2016 | Kobayashi et al. | |

FOREIGN PATENT DOCUMENTS

| | | |
|---|---|---|
| WO | 9940655 | 8/1999 |
| WO | 2012142365 A2 | 10/2012 |
| WO | WO 2017/053426 | * 3/2017 |

OTHER PUBLICATIONS

Cai, et al., "Crtsyallization of Organic Glasses: Effects of Polymer Additives on Bulk and Surface Crystal Growth in Amorphous Nifedipine", In Pharmaceutical Research, vol. 28, Jun. 3, 2011, pp. 2458-2466.

Cha, et al., "New Spiro[benzotetraphene-fluorene] Derivatives: Synthesis and Application in Sky-Blue Fluorescent Host Materials", In Journal of Fluorescence, vol. 24, May 25, 2014, pp. 1215-1224.

Derose, Paul C., "Standard Guide to Fluorescence—Instrument Calibration and Validation", Oct. 2007, 27 pages.

Kim, et al., "Blue OLEDs Utilizing Spiro[fluorene-7,9'-benzofluorene]-type Compounds as Hosts and Dopants", In Bull. Korean Chem. Soc., vol. 30, No. 3, Jan. 28, 2009, pp. 647-652.

Powell, et al., "Fracture of Molecular Glasses Under Tension and Increasing Their Fracture Resistance With Polymer Additivies", In Journal of Non-Crystalline Solids, vol. 429, 2015, pp. 122-128.

Salbeck, et al., "Spiro Linked Compounds for Use as Active Materials in Organic Light Emitting Diodes", In Macromolecular Symposia, vol. 125, 1997, pp. 121-132.

Wei, et al., "Properties of Fluorenyl Silanes in Organic Light Emitting Diodes", In Chemistry of Materials, vol. 22, 2010, pp. 1724-1731.

Wu, et al., "Synthesis of Amorphous Monomeric Glass Mixtures for Organic Electronic Applications", In Journal of Organic Chemistry, vol. 80, 2015, pp. 12740-12745.

* cited by examiner

*Primary Examiner* — C Melissa Koslow
(74) *Attorney, Agent, or Firm* — Medley, Behrens & Lewis, LLC

(57) ABSTRACT

A mixed compound glass scintillator includes a first compound and a second compound. The first compound has a Tg greater than 25° C., is organic, is capable of generating luminescence in the presence of ionizing radiation. The first compound includes a central species and a luminescent organic group bonded to the central species or to an optional organic linker group. The central species is selected from the group consisting of: carbon, silicon, and tin. The optional organic linker group, if present, is bonded to the central species and the luminescent organic group. The second compound also has a Tg greater than 25° C. The first and second compound are mixed and melted to form a glass material.

20 Claims, 10 Drawing Sheets

MIXED COMPOUND ORGANIC GLASS SCINTILLATORS

GOVERNMENT RIGHTS

This invention was made with Government support under Contract No. DE-NA0003525 awarded by the United States Department of Energy/National Nuclear Security Administration. The U.S. Government has certain rights in the invention.

FIELD

This disclosure relates to organic glass material that can be used as scintillators or in OLEDs.

BACKGROUND

Luminescent organic materials have attracted significant recent attention due to their role in a variety of functional devices. One particular area of interest comprises organic light emitting diodes (OLEDs), which operate based on charge injection and radiative recombination in multilayer devices. A related but more specialized application that is based on similar principles of charge transport and exciton mobility involves organic materials for the detection of ionizing radiation. This application serves as the basis for nuclear non-proliferation detection of illicit nuclear materials such as highly enriched uranium or plutonium.

Organic scintillators possess the unique ability to discriminate ionization caused by fast neutron recoils on nuclei from that caused by Compton scattering of gamma-rays on electrons, owing to differences in the emission kinetics of the produced light pulses. These differences are evident in the relative fraction of light produced via prompt singlet fluorescence versus delayed triplet-triplet annihilation (TTA). In practice, nuclear recoils from fast neutron interactions produce a greater proportion of delayed luminescence than gamma-rays and can be identified by their characteristic pulse shape. This is due to a phenomenon known as ionization quenching, which leads to a reduction in the relative proportion of prompt fluorescence for neutron versus gamma-ray events. In mixed fluorophore systems, such as plastics and liquids, Förster resonant energy transfer also plays a role. This technique for identifying the type of incident particle is known as pulse-shape discrimination (PSD).

While this pulse-shape discrimination technique is effective in some materials such as trans-stilbene single crystals or liquid scintillation mixtures, there are several limitations that preclude their use in critical applications such as radiation portal monitors used at border crossings and ports-of-entry. First, PSD is easily disrupted by the presence of disorder or impurities. This is primarily due to a reliance upon TTA to provide the delayed emission component. TTA is a bimolecular recombination process that requires Dexter electronic interaction between two triplet excited states, the probability of which decreases exponentially as a function of distance. The presence of disorder or impurities decreases the effective triplet exciton lifetime due to a higher density of trapping sites that compete with TTA. Several limitations and challenges remain in maximizing the various properties of these types of materials.

The combination of these limitations has led to significant interest in non-crystalline organic scintillators based on polymers and organic liquids. See Knoll, G. F. *Radiation Detection and Measurement*, 4th ed.; John Wiley & Sons: Hoboken, N.J., 2010. Various strategies have been employed to achieve neutron/gamma PSD in these materials, although the obtained scintillation light yields and discrimination performance have been found to be distinctly inferior to single crystals. See Bourne, M. M.; Clarke, S. D.; Adamowicz, N.; Pozzi, S. A.; Zaitseva, N.; Carman, L. *Nucl. Instrum. Methods Phys. Res., Sect. A* 2016, 806, 348-355 and Feng. P. L.; Villone, J.; Hattar, K.; Mrowka, S.; Wong, B. M.; Allendorf, M. D.; Doty, F. P. *IEEE Trans. Nucl. Sci.* 2012, 59, 3312-3319.

The performance of an organic scintillator is influenced by the efficiency and kinetics of radiative decay processes that are associated with ion recombination and exciton transport. It is difficult to maximize scintillation performance in organic scintillators while also achieving stability in optical, electronic, and morphological properties, and doing so with cost-effective materials.

SUMMARY

The materials disclosed herein are engineered to improve the radiation detection performance and long-term stability of organic-based scintillators by controlling the molecular and bulk properties of transparent organic glasses.

Disclosed herein is the preparation of low-cost/large-scale organic glass scintillators enabled by rapid fabrication via a bulk melt-casting procedure. The materials disclosed herein were observed to have high scintillation light yields exceeding that of trans-stilbene, which is one of the brightest known organic scintillators, but is expensive, and has low fracture toughness, limited size, and a highly anisotropic scintillation response. Organic electronics, such as OLEDs, may also benefit from these materials due to similar requirements, including high luminosity, high electron/hole mobility, and stable film-forming properties.

In an embodiment, a mixed compound glass scintillator includes a first compound and a second compound. The first compound has a Tg greater than 25° C., is organic, is capable of generating luminescence in the presence of ionizing radiation. The first compound includes a central species and a luminescent organic group bonded to the central species or to an optional organic linker group. The central species is selected from the group consisting of: silicon, carbon, and tin; or a rotationally symmetric organic species, or combination of any of the these. The optional organic linker group, if present, is bonded to the central species and the luminescent organic group. The second compound also has a Tg greater than 25° C. The first and second compound are mixed and melted to form a glass material.

In an embodiment, a method of making a glass compound includes the steps of: mixing a first compound and a second compound, melting the first and second compound to form a mixed and melted compound, and cooling the mixed and melted compound to form a mixed compound glass scintillator. The first compound includes a central species and a luminescent organic group bonded to the central species or to an optional organic linker group. The central species is selected from the group consisting of: carbon, silicon, and tin. The optional organic linker group, if present, is bonded to the central species and the luminescent organic group. The second compound also has a Tg greater than 25° C.

By a "central species selected from the group consisting of: carbon," it is meant a carbon atom, not a carbon containing group.

DETAILED DESCRIPTION

Figure 1:
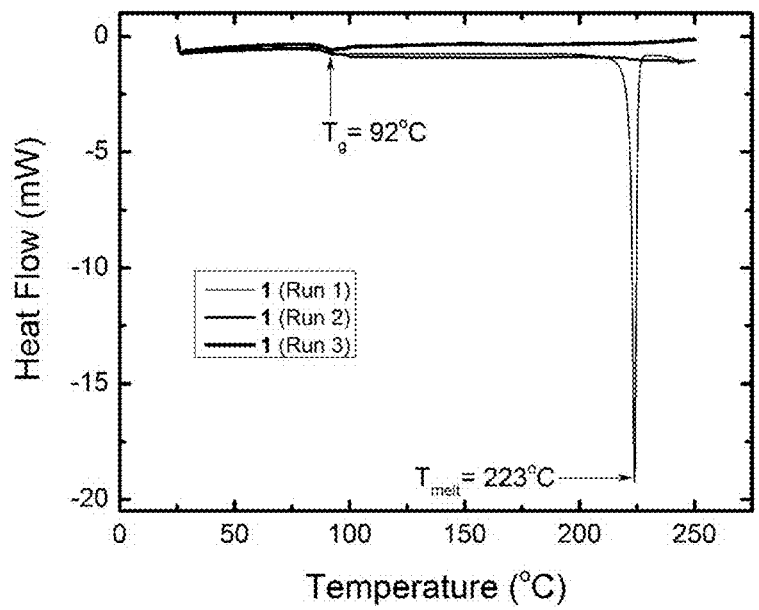
FIGS. 1-4 show DSC traces for Examples 1, 2, 6, and 7, respectively.
Figure 2:
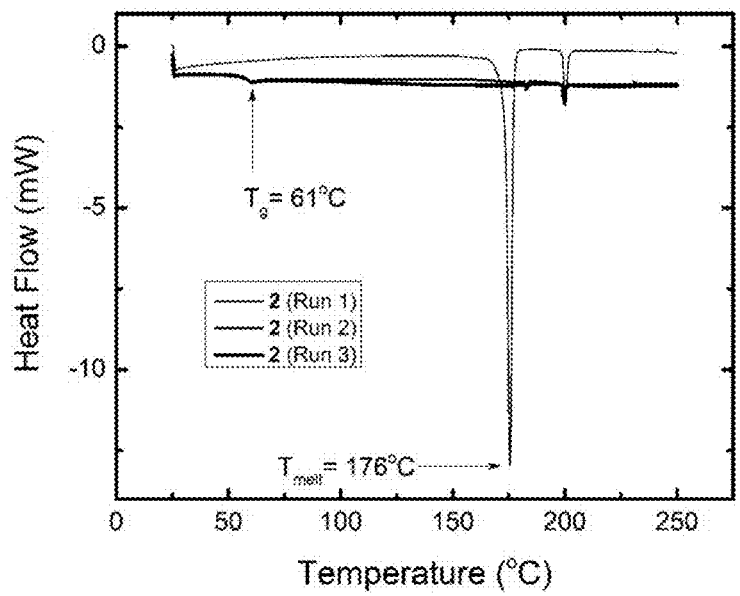
Figure 3:
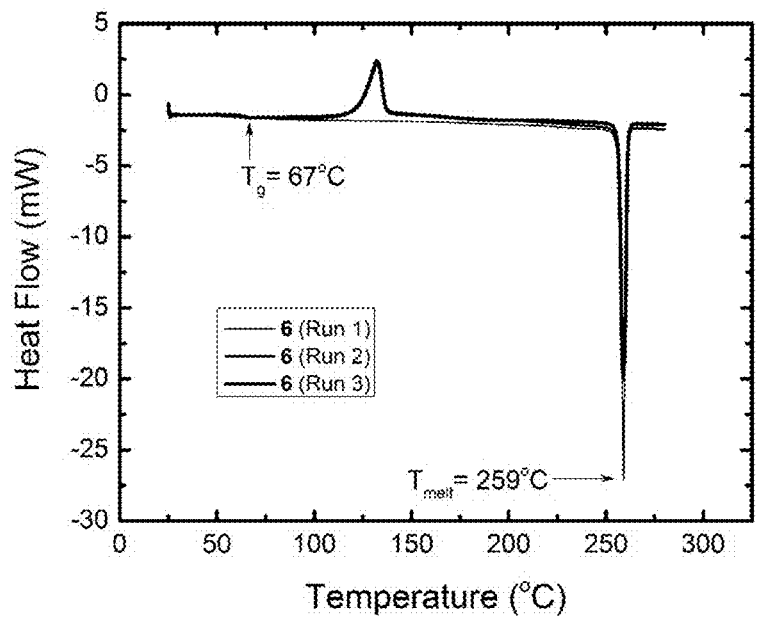
Figure 4:
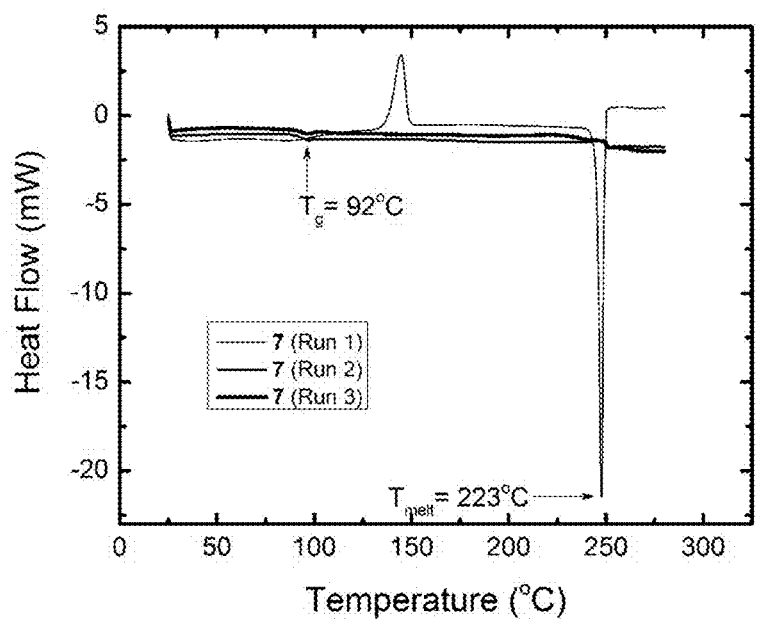

The materials and methods disclosed herein involve dramatically improving the performance and long-term stability of organic glass scintillators, even over those disclosed in the recently filed and co-owned application U.S. application Ser. No. 15/289,611, filed on Oct. 10, 2016, titled "High-Efficiency Organic Glass Scintillators," now issued as U.S. Pat. No. 9,845,334, which is incorporated herein by reference. This was achieved by blending two or more glass-forming compounds to achieve properties that are improved over any of the respective pure components. In an embodiment, the present mixed compound glass scintillator may comprise two or more organic compounds that may or may not form stable glass materials individually in their pure forms.

The materials disclosed herein were synthesized in attempts to achieve a glass scintillator material that has the following characteristics:
(1) minimal optical self-absorption;
(2) fast emission timing (fast counting);
(3) emission wavelength matching to photodetector (typically 300 to 500 nm);
(4) high conversion of radiation energy to visible light (light yield);
(5) discrimination between different types of radiation;
(6) high energy resolution/spectroscopy; and
(7) amenable to large sizes, low cost, strength, and multiple form factors.

To achieve these ends, it was postulated that a fluorophore-bearing molecule that crystallizes in a cubic space group could give the desired optical, mechanical, and photophysical properties. Many of these considerations are controlled by second-rank tensors, which are symmetry-dependent properties that include the transport mobility, stress, strain, thermal expansion coefficient, and dielectric constant, among others.7 It is known that without bearing some element of symmetry, organic molecules tend to crystallize in lower symmetry space groups (i.e. triclinic or monoclinic), which establishes limitations on these properties. Price, S. L. *Chem. Soc. Rev.* 2014, 43, 2098-2111. One relevant example relates to the dissipation of stresses in a low-symmetry crystal such as trans-stilbene. In this case, brittle fracture is a typical failure mode due to an insufficient number of independent slip systems to dissipate an applied stress.

Through various experiments on $C_3$-symmetrical compounds with additional functional groups, it was discovered that fluorene compounds were excellent candidates for scintillating fluorophores. Despite emitting in the 420 nm region, fluorene and its derivatives have not been widely explored in the context of scintillators. Fluorene possesses an advantage in that it can be readily derivatized at the benzylic position to provide oxidative stability and enable facile modification of properties.

It was discovered that compounds based on fluorene chromophores were not only capable of crystallization into higher symmetry space groups, but also capable of providing higher scintillation light yields and PSD performance than trans-stilbene. See Carlson, J. S.; Feng, P. L. *Nucl. Instrum. Methods Phys. Res., Sect. A* 2016, 832, 152-157. Examples of these compounds are shown below.

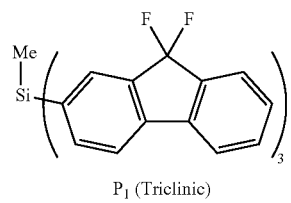

$P_1$ (Triclinic)

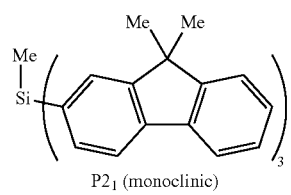

$P2_1$ (monoclinic)

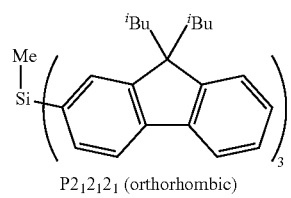

$P2_12_12_1$ (orthorhombic)

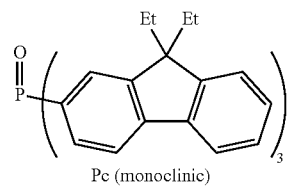

Pc (monoclinic)

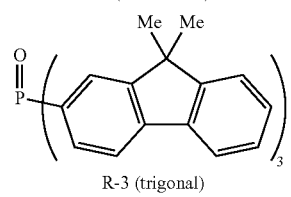

R-3 (trigonal)

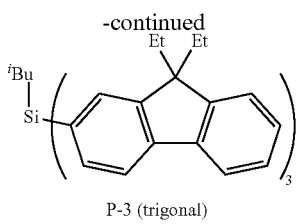

P-3 (trigonal)

The observation of a stable glassy state in these compounds represents a paradigm shift in scintillator research that has related implications for improving OLED device stability and performance. The nature of the glassy state also enables facile tuning of the fluorescence properties.

It was also determined that $C_3$-symmetric moieties were not necessarily a constraining factor to reaching the improved scintillating material, but rather other types of materials that could be cast as organic glasses could also be used. See e.g., compounds 4 and 5 below:

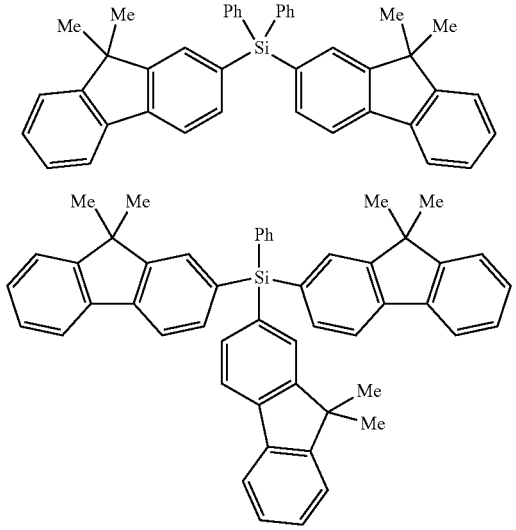

It was further determined that singlet wavelength shifters, such as 9,10-diphenylanthracene (DPA), could be used to improve the properties of the material. A wavelength shifter improves light yield by increasing the Stokes shift so as to reduce self-absorption in the material (compared to the undoped material). Furthermore, triplet harvesting dopants, such as Bis[2-(4,6-difluorophenyl)pyridinato-C2,N](picolinato) iridium(III) (FIrpic), also were found to dramatically increase certain properties.

Individual glass scintillator compounds (compounds 4 and 5) were tested at sizes coinciding with known benchmark materials at about 2 grams. After several weeks at room temperature the sample slowly began to turn opaque on the surface and eventually the entire sample, resulting from crystallization that was confirmed by powder X-ray diffraction (XRD). Delayed crystallization would make organic glasses ineligible for practical use in the field. The glass to crystal transition can proceed by two modes: a glass-to-crystal transition originating from the bulk or originating from the surface. While there are known inhibition methods for both types of growth, the inventors pursued novel formulations of the glass materials, i.e. a co-melt formulation of more than one material in an attempt to address this problem. It was thus unexpectedly discovered that certain mixtures of compounds were indefinitely resistant to crystallization under advanced aging conditions as disclosed in the examples section.

It is believed that the following factors contribute to selection of compounds that are suitable for mixing to obtain improved stability.

(1) The compounds that are mixed are similar in the amount of energy, in terms of the rate at which they absorb and emit light, such as for example, within 10%, within 5%, or within 1% of each other in photons/MeVee as determined with a trans-stilbene reference.

(2) The fluorene compound or a derivative or analog thereof is used as at least one of the materials. Fluorene has shown to be particularly resistant to crystallization, in particular a fluorene compound that is substituted at the benzylic carbon position.

(3) The compounds that are mixed are enantiomers or diastereomers of each other.

(4) The compounds that are mixed have minimal absorption to each other's photo emissions.

(5) In an embodiment, the first compound absorbs and emits light with a quantum yield that exceeds 0.3 by an integrating sphere at sample method according to NIST standard NISTIR 7458, such as for example, 0.4 to 1, or 0.5 to 0.8. In another embodiment, both the first and second compounds absorb and emit light with these quantum yields.

In an embodiment, the compounds that are mixed each form a glass compound of moderate stability on their own. That is, each compound does not visibly cloud due to recrystallization within two weeks from casting. The components used to form the 'mixed melt' glasses may include one or a combination of organic or organometallic compounds selected from materials that are luminescent or non-luminescent on their own. In an embodiment, one or more of the glass compounds may not be even moderately stable in the pure form.

In an embodiment, there is at least one luminescent glass compound in the mixture. The role of the luminescent glass compound is to provide a light emission response to ionizing radiation (scintillation) and secondarily to improve the physical properties (material stability, resistance to crystallization, mechanical toughness, among others). The other glass compound in the mix need not necessarily be luminescent.

In an embodiment, polymers with a Tg of 25° C. or higher may be used as one of the components of the mixed compounds. For example, a non-crystalline polymer or one having a crystallinity of less than 5% by weight, such as an atactic vinyl aromatic polymer with 8 to 50 carbon atoms in its monomeric units may be used. Examples include, homopolymers or copolymers of styrene, methylstyrene, and acrylic polymers, such as poly(methyl methacrylate). These are also believed to inhibit crystallization. In fact, this was demonstrated effectively for a blend comprising (10% of polystyrene+90% of compound 4).

In an embodiment, the glass scintillators may be mixed in a ratio of 90%:10% to 10%:90%, such as 70%:30% to 30%:70%, or 55%:45% to 45%:55% by weight.

In an embodiment, the mixed glass scintillator system comprises the two glass components: bis(9,9-dimethylfluorenyl) diphenylsilane (compound 4), and tris(9,9-dimethylfluorenyl) phenylsilane (compound 5). As demonstrated in the examples section below, the 90%:10% compound 4:compound 5 mixed glass scintillator was found to possess a light yield and neutron/gamma discrimination figure-of-merit that was synergistically better than either of the pure compounds 4 or 5. Furthermore, although, neither compound 4 nor compound 5 was separately found to form indefinitely stable glasses when exposed to accelerated aging conditions (80° C.), several of the blends were found to have no detectable crystallization even when aged at 80° C. for extended time intervals (several weeks or longer). Additionally, radiation measurements indicated cooperative effects upon the scintillation properties for some of the mixed melt glasses. This finding is hypothesized to be associated with improved singlet and triplet energy transfer within the mixed matrix, respectively.

It must be noted that not all mixed melt blends exhibit enhanced scintillation properties, which suggests a dependence upon the electronic and molecular structures of components in the melt. Proper combinations however, can be determined from the guidance provided herein, and the examples and experiments disclosed herein with techniques well-known to those of ordinary skill in the art.

This class of organic-based glass scintillators may be melt-cast to produce highly transparent glasses that have been shown to individually provide high light yields of 12,000 to 40,000 photons/MeVee, 13,000 to 20,000, or 16,000 to 18,000 photons/MeVee as determined with a trans-stilbene reference. This method of determination is well known and is disclosed in "Radiation Detection and Measurement" Third Edition, Glenn F. Knoll, John Wiley and Sons, Inc., 2000, Chapter 4, Pg. 110, incorporated herein by reference. In embodiments, this class of luminescent glass material exceeds the light yield of EJ-200 plastic scintillators and solution-grown trans-stilbene crystals. The individual organic glasses exhibit neutron/gamma pulse-shape discrimination (PSD) and are compatible with wavelength shifters to reduce optical self-absorption effects that are intrinsic to pure materials such as crystalline organics. In an embodiment, the amorphous glass is capable of both neutron and gamma pulse-shape discrimination at 33 keVee to 30 MeVee, such as 100 to 1000 keVee, or 250 to 500 keVee. Overall, this class of glass scintillators are capable of generating luminescence in the presence of ionizing radiation, such as radiation at energy levels of 1,000 eVs to 30,000 eVs. The combination of high scintillation efficiency, PSD capabilities makes this class of glass materials excellent candidates for one or more, or all of the glass components of the combined glass melt of the present application.

This class of symmetric glass scintillator material includes a central atom or species and one or more luminescent organic groups bonded to atom or species. In one embodiment, luminescent groups are bonded in a configuration as to disrupt pi-pi stacking, and thereby raising the kinetic barrier for crystallization to occur. In another embodiment, or in combination with the embodiment above, steric bulk can be introduced on or near the luminescent groups to disrupt pi-pi stacking. In another embodiment or in a combination with the embodiment above, the benzylic carbons of the ligands are modified to result in improved properties. The disclosure herein focuses primarily on the development and properties of optically transparent organic glass scintillators that are based upon a silicon central atom surrounded by three functionalized fluorene chromophores. However, the specific organic glass scintillators disclosed in this class are not limited to these specific compounds.

In an embodiment, the central atom or species of the first or second compound may be carbon, silicon, phosphorus (for the second compound only), nitrogen (as the free base or salt) (for the second compound only), tin, or germanium (for the second compound only). These atoms were determined to be conducive to a tetrahedral or tripodal geometry and to the other desired criteria of the overall materials, i.e., glass-like and possessing scintillating properties.

In an embodiment, the central atom or species can be at any one of its stable oxidation states. The central atom or species may also be an oxide of any of these or in a salt or alkyl salt form. An example of an oxide would include phosphorous as the tri-substituted phosphine or phosphine oxide.

In an embodiment, the central moiety can include multiple bonded atoms. For example, rotationally symmetric organic species can be selected for the central species of the compound. These include, for example, aliphatic, aromatic, heteroaromatic or polycyclic aromatic central groups, such as adamantane, tri-substituted benzene, truxene, triphenylene, spiro-bifluorene, and analogs thereof. Analogs thereof may, for example, include substitutions of hydrogen atoms or units of unsaturation with alkyl, aryl, heterocycles, halogens, or heteroatoms of type $BR_2$, $B(OR)_2$, $NR_2$, OR where R is alkyl or aryl. The alkyl groups, may, for example, be straight, branched or cyclic, and have 1 to 20 carbon atoms. The aryl groups may, for example, have five to twenty carbon atoms in the ring structure.

The compounds disclosed herein comprise luminescent organic groups that are bonded to the central atom or species. Organic generally means the elements of life, and encompasses carbon containing compounds and may also include oxygen, nitrogen, sulfur, phosphorous, halogens, and alkali metals. In an embodiment, the luminescent organic group comprises an aromatic species that is a chromophore. In an embodiment, the luminescent group is a polycyclic or polycyclic aromatic group.

In an embodiment, the luminescent organic group comprises, for example, fluorophores selected from terphenyl, trans-stilbene, naphthalene, anthracene, truxene, triphenylene, 1,3,5-triphenylbenzene, spirobifluorene, fluorene, carbazole, coumarin, anthracene, naphthalene, biphenyl, coumarin, phenyloxazole, phenyloxadiazole and analogs thereof. Analogs thereof may, for example, include substitutions of hydrogen atoms or units of unsaturation with alkyl, aryl, heterocycles, halogens, or heteroatoms of type $BR_2$, $B(OR)_2$, $NR_2$, OR where R is alkyl or aryl. Substitutions may occur at the benzylic carbon position.

In certain embodiments, the luminescent organic groups are selected from functionalized organic chromophores that intrinsically behave as a scintillator. These compounds may include, for example, compounds such as:

(C3-symmetric examples): truxene, triphenylene, 1,3,5-triphenylbenzene, and analogs thereof.

(Non-C3-symmetric examples): Spirobifluorene, fluorene, carbazole, coumarin, anthracene, naphthalene, biphenyl, coumarin, phenyloxazole, phenyloxadiazole and analogs thereof.

The term "analogs thereof" is defined as above. The aryl groups may, for example, have five to twenty carbon atoms in the ring structure.

These examples typically are chemically modified (e.g., derivatized) to prevent spontaneous recrystallization upon cooling. Effective strategies to this end include the incorporation of linear or branched alkyl groups, or heteroatoms of type $BR_2$, $B(OR)_2$, $NR_2$, OR where R is alkyl or aryl. In an embodiment, the alkyl groups, aryl groups, or R groups may, for example, have 1 to 20, 5 to 18, or 6 to 16 carbon atoms.

Additional examples of fluorophore groups that may be attached to symmetric organic central moieties may comprise a wide range of known scintillating molecules, including, but not limited to: the structures (I) to (IX) below, 2,5-diphenyloxazole, 9,9'-dialkylfluorene, 9,9'-diarylfluorene, aryl- and/or alkyl substituted diarylfluorene such as is shown in structure I below (in particular, 2-aryl-9,9'-dialkylfluorene, 2-aryl-9,9'-diarylfluorene,) 7-aryl-9,9'-dialkylfluorene, 7-aryl-9,9'-diarylfluorene, 7-alkyl-9,9'-dialkylfluorene, 7-alkyl-9,9'-diarylfluorene, 9,10-diphenylanthracene, 2,5-diphenyl-1,3,4-oxadiazole, p-terphenyl, salicylic acid, and methyl salicylate, and analogs thereof (as defined above).

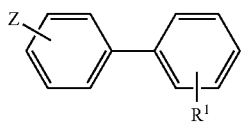
(I)

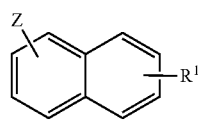
(II)

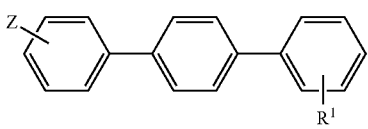
(III)

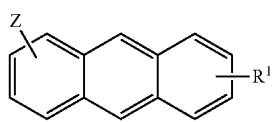
(IV)

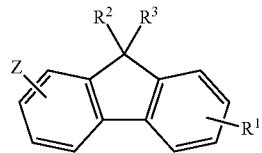
(V)

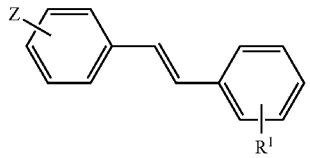
(VI)

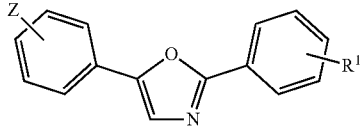
(VII)

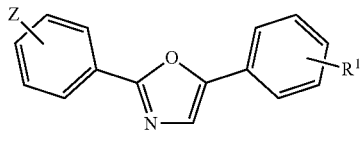
(VIII)

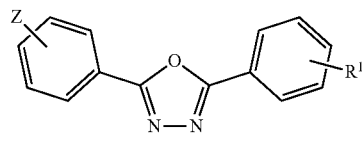
(IX)

In structure (I) to (IX) Z is the central atom or species. $R^1$ is H, alkyl, alkoxy, aryl, aryloxy, B(aryl)$_2$, B(alkoxy)$_2$, N(alkyl)$_2$, or a halogen. The alkyl, alkoxy, aryl, and aryloxy groups may contain 1 to 20, 5 to 18, or 6 to 16 carbon atoms. $R^2$ and $R^3$ may be independently selected from alkyl groups, F, and oxygen. The hovering bond of Z and $R^1$ denotes that substitution can be at any point on the ring.

In an embodiment, the luminescent organic group may comprise, for example, functionalized fluorene or oxadiazole fluorophores. In particular, these groups may be paired with amine, silicon or phosphine oxide central species.

In an embodiment, each luminescent organic group may have a number average molecular weight of 100 to 2,500 Dalton (g/mol), such as 300 to 1200 Dalton, or 500 to 1000 Dalton.

In an embodiment, the luminescent organic group comprises a polycyclic group comprising one or more benzylic carbons and at least one benzylic carbon is substituted with an organic group. In an embodiment, the benzylic carbon that is substituted is a double benzylic carbon. The organic group may be an alkyl group, for example, a linear 1 to 6, branched, cyclic, or aromatic group, having 1 to 20 carbon atoms, such as 4 to 15, or 5 to 8 carbon atoms. As explained further below the organic group on the one or more benzylic carbons should be selected to inhibit pi-pi stacking in the compound.

In an embodiment, the luminescent organic group is selected from the group consisting of: quaterphenyl, terphenyl, trans-stilbene, naphthalene, anthracene, truxene, triphenylene, 1,3,5-triphenylbenzene, spirobifluorene, fluorene, carbazole, coumarin, anthracene, naphthalene, biphenyl, coumarin, phenyloxazole, phenyloxadiazole, 2,5-diphenyloxazole, 9,9'-dialkylfluorene, 9,9'-diarylfluorene, 2-aryl-9,9'-dialkylfluorene, 2-aryl-9,9'-diarylfluorene, 7-aryl-9,9'-dialkylfluorene, 7-aryl-9,9'-diarylfluorene, 7-alkyl-9,9'-dialkylfluorene, 7-alkyl-9,9'-diarylfluorene, 9,10-diphenylanthracene, 2,5-diphenyl-1,3,4-oxadiazole, p-terphenyl, salicylic acid, and methyl salicylate and analogs thereof In an embodiment, there is a linker atom or group between the central atom/moiety and the fluorophore. The linker group can be a linear or branched alkyl, aryl, heteroaryl, heteroalkyl group, or combinations thereof. The linker group is an optional component of the compound. Representative examples are depicted in structure (X) to (XII).

(X)

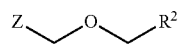
(XI)

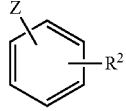
(XII)

wherein Z is the central species or atom, n=1-5, and $R^2$ is the fluorescent organic group.

Additional examples of silicon-centered compounds include those represented by formula XIII:

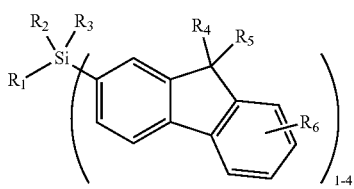

XIII

The R groups ($R_1$ to $R_6$) in formula XIII may be independently selected alkyl or aryl groups, for example, linear, branched, cyclic, or aromatic groups, each having 1 to 24 carbon atoms, such as 4 to 15, or 5 to 8 carbon atoms. The R groups may be the same or different. In an embodiment, one or more of $R_1$, $R_2$, or $R_3$ are not present, in this case the subscript on the fluorene group may range from 2-4. Formula XIII also includes diastereomers and enantiomers, where the fluorene moiety or the alkyl groups are stereocenters. Formulae XIV and XV are further examples of such.

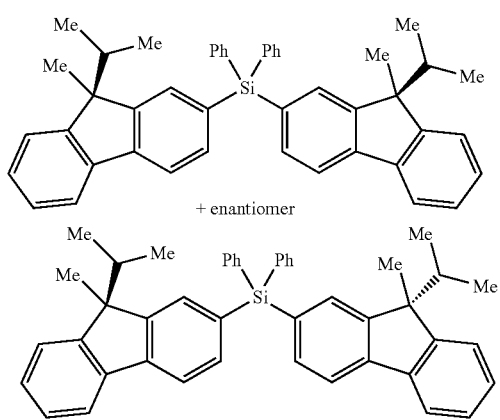

XIV

Formula XIV represents a mixture of diastereomers with the fluorene moiety as the stereocenter.

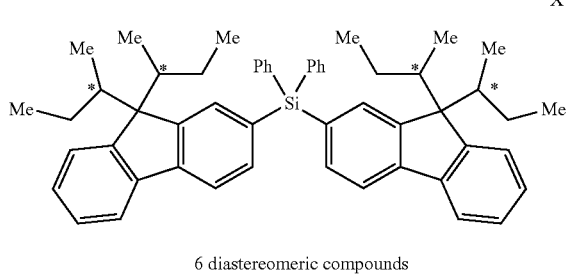

XV 6 diastereomeric compounds

Formula XV represents six diastereomeric compounds with the substituent alkyl groups as the stereocenters.

Two general methods have been used to obtain organic molecules that form glassy states: (1) design of an overall three-dimensional structure that prevents efficient pi-pi stacking interaction, which can include luminescent organic groups arranged in a tetrahedral or spirocyclic configuration; and (2) the presence of bulky functional groups either directly attached, or two to three bonds away from the luminescent organic group that prevents efficient pi-pi stack-ing interaction. This selection criteria can produce compounds amenable to forming a stable glassy state despite the native fluorophore not able to form a stable glassy state.

More particularly, techniques or predictors disclosed herein found to affect the compound's ability for high scintillation and to resist crystallization are (a) selecting luminescent groups that have high quantum yields, and (b) selecting a central atom or species with a particular bond length and angle with the luminescent groups (e.g., tetrahedral or tripodal geometries), and (c) choosing appropriate functionality on the non-aromatic portion of the molecule to inhibit aromatic stacking.

The central atom and luminescent organic groups should be selected to result in stable organic glasses following cooling of the melt. The luminescent organic group can be added through symmetry modification of the compound (i.e. C3 rotational symmetry element) or the chemical functionalization of the compound to confer resistance to crystallization upon cooling (i.e. addition of aliphatic, alkoxy-, or other functional groups).

The selection of the luminescent organic group also has implications for the electronic properties of the glass, particularly with respect to the electron and hole mobilities. These properties are important for neutron/gamma pulse-shape discrimination (PSD), which is a widely used technique for the detection of special nuclear materials.

In an embodiment, the central atom or moiety and the luminescent organic groups are selected to produce a compound with as high a glass transition temperature (Tg) as possible. Embodiments with higher Tgs produce less transient effects and are typically more stable. In another embodiment, the central atom or moiety and the luminescent organic groups may have a low Tg. At or above the Tg, crystallization may occur, but the radioluminescent properties may improve as well. Compact luminescent groups typically predict a higher Tg and form a molecular structure with a roughly spherical shape.

In an embodiment, the organic glass luminescent compound has a trigonal pyramidal or tetrahedral structure that is tripodal with the luminescent organic group substitutions, i.e., three substitutions with luminescent organic groups and optionally has a fourth organic substituted group (not necessarily a luminescent group). In a particular embodiment, the fourth organic group is an oxygen atom and is bonded to a phosphorous central atom. Some representative trigonal pyramidal or tetrahedral structures for the glass scintillator are shown in the Examples section below.

An additional distinction of the molecules shown in the example structures disclosed herein is that they typically exhibit high melting temperatures of greater than 150° C. and relatively high glass transition temperatures (Tg) of 50° C. to 160° C. This is in contrast with many amorphous organic materials, such as polymers (high molecular weight compounds) and organogels, which make use of long alkyl chains to attain a stable amorphous phase. Compared to the compact luminescent glasses described herein, polymers and organogels contain large regions of non-fluorescent moieties, which limit their application for use as an organic scintillator.

It is also possible to modify the glass-forming properties of the glass scintillator compound by controlled substitution of the different positions of the molecule. Using the silyl-based compounds as an example, it was discovered that a less bulky group, such as, for example, a linear hydrocarbon, at the axial silicon site leads to glasses that are more resistant towards crystallization, whereas bulky hydrocarbons tend to possess higher Tg values but also the potential to recrystallize over time. Modification of the benzylic carbon in the case of the fluorene-based fluorophores, leads to profound changes in thermal properties. A change from gem-dimethylfluorene to gem-dipropylfluorene (gem as known to those of skill in the art means "geminal," and indicates a relationship of two groups attached to the same carbon) groups results in a decrease in Tg from 93° C. to 55° C. Separately, insertion of a benzene group between the silicon atom and the 2-fluorene position of the ligands has been shown to increase the Tg to 130° C., while retaining the intrinsic amorphous properties of the material.

The geometry of the scintillator can also be manipulated to resist aromatic stacking by partial substitution of the central atom, for example, compounds that are based on a central atom or species that has only been di-substituted with the fluorescent groups. While this has been shown to result in generally lower glass transition temperatures than the tri- and tetra-substituted analogs, this method is an alternate route to prepare the glass scintillator materials.

In a class of organic glass materials, the luminescent organic groups are not identical to each other, and the different luminescent organic groups may or may not undergo intramolecular energy transfer between them. The potential advantages of this approach are to increase the scintillation light yield, further improve the melt and glass-formation properties, and/or shift the emission wavelength into a longer wavelength region for better compatibility with the employed photodetector.

In a class of organic glass materials, the organic glass materials may be those disclosed above, but are non-identical because of their stereochemical characteristics.

The mixture of organic compounds may include one, two, or more than two compounds from those disclosed above. In an embodiment, the mixture of organic compounds may include one, two, or more than two organic components with non-identical groups, such as those disclosed above.

In an embodiment. a mixed compound glass scintillator includes a first compound and a second compound. The first compound has a Tg greater than 25° C., is organic, is capable of generating luminescence in the presence of ionizing radiation. The first compound includes a central species and a luminescent organic group bonded to the central species or to an optional organic linker group. The central species is selected from the group consisting of: carbon, silicon, and tin. The optional organic linker group, if present, is bonded to the central species and the luminescent organic group. The second compound also has a Tg greater than 25° C. The first and second compound are mixed and melted to form a glass material.

In an embodiment, the second compound is a fluorescent organic molecule, and in an embodiment also includes a central species and a luminescent organic group bonded to the central species or to an optional organic linker group. The central species, luminescent organic group and optional organic linker group may be selected from those disclosed for the first compound. In an embodiment, the first and second compounds are enantiomers or diastereomers.

The general and specific structures provided herein, the teachings in the Example section and the design criteria and theory provided herein are provided for those skilled in the art to select the appropriate central atoms and luminescent groups for this class of organic glass compounds.

One or more non-luminescent additives may also be included in the mixed compound glass scintillator. These may be included for two reasons: (1) to modify the physical properties, and/or (2) to modify the chemical composition of the scintillator for enhanced detection sensitivity. The latter consideration is of particular significance towards enabling gamma-ray spectroscopy as an additional capability of these materials. By adding certain dopants that quench emission, shorter pulses of light emission for each radiation event are observed. This is advantageous for some applications, including correlated particle counting and imaging. These non-luminescent additives may be organo-tin compounds, wavelength shifters, or triplet harvesting dopants.

In an embodiment, one or more of the organic glasses in the mixed glass is a tin-loaded glass. This involves incorporation of organo-tin compound or compounds into the glasses disclosed above. In embodiments incorporation of the organo-tin compound improves full gamma absorption.

Fluorescent quenching additives may be added to the glass to shorten the scintillation decay time for fast timing applications. These quenchers are known to those skilled in the art and may comprise compounds belonging to the following general classes: heavy-atom (organometallic or organohalide), low-lying triplet (benzophenone, other aromatic carbonyls, etc.), and charge-transfer (cyano, nitro, amine) quenching compounds.

Wavelength shifters and triplet harvesting dopants may be added to the glass compound. These may be employed to provide a higher quantum yield. One example of a wavelength shifter successfully employed in the materials disclosed herein is 9,10-diphenylanthracene (DPA). Other wavelength shifters known to those of skill in the art may also be added to the glass composition, such as 1,4-bis(5-phenyl-2-oxazolyl)benzene (POPOP), 4,4'-bis(2,2'-diphenylvinyl)-1,1'-biphenyl (DPVBi), and 1,4-bis(2-methylstyryl)benzene (MSB). Triplet harvesting dopants such as Bis[2-(4,6-difluorophenyl)pyridinato-C2,N](picolinato)iridium(III) (FIRPic) may also be used. All of these example non-luminescent compounds are shown in structural detail below.

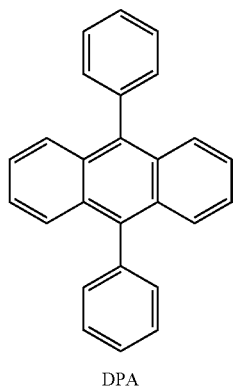

DPA

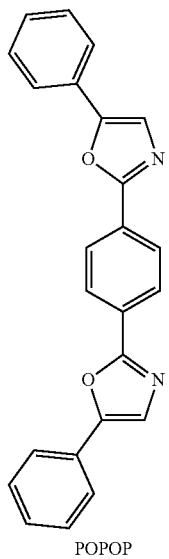

POPOP

-continued

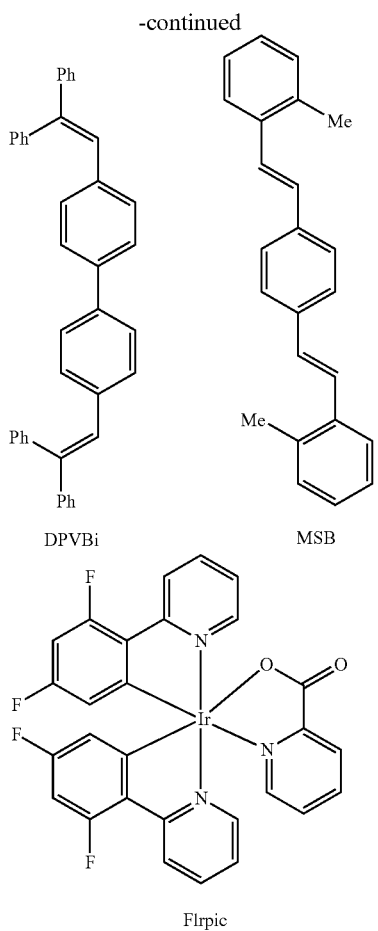

DPVBi

MSB

Flrpic

In an embodiment, homogenous incorporation of the wavelength shifter into the mixture of one or both of the organic glass compounds is done prior to the melt process. In an embodiment, the wavelength shifter or shifters are added to the composition prior to the melt process, as they are dissolved in solution and then concentrated in vacuo to produce a solid. The solid can then be used in the melt process. In another embodiment, the wavelength shifter is added during the melt process as the first and second compounds are in the melt state.

This strategy unexpectedly provides glass scintillators that exhibit light yields greater than all known plastic and liquid scintillators, and brighter than trans-stilbene single crystals. The use of wavelength shifters in liquid or plastic scintillators may produce large Stokes' shifts and thus long optical attenuation lengths. The use of wavelength shifters for organic molecular crystalline scintillators has not been demonstrated. Such wavelength shifters limit the light yield for crystals with large spectral self-overlap especially for crystals larger in sizes. In contrast, in the glass materials disclosed herein, incorporation of wavelength shifters produces a decrease in the extent of fluorescence self-absorption following the incorporation of the wavelength shifter. This is beneficial for consistent scintillator performance in larger detector volumes.

In an embodiment, the non-luminescent additive is incorporated into the glass mixture in a weight percentage of 0.01% to 10%, such as 0.03% to 6%, or 0.05% to 1% by weight. In particular, for triplet harvesting dopants, such as iridium based dopants effective amounts may be present in amounts of 0.01 to 3%, such as 0.1% to 1%, or even as low as 0.03% to 0.3%, such as 0.04% to 0.2%, or 0.05% to 0.15%.

With DPA it was determined that the maximum benefit for light yield and PSD was obtained with a DPA concentration of 0.05% (w/w) outperforming stilbene in both respects. The concentration provided is the fractional mass of the wavelength shifter, per the total mass of mixture*100. A survey of other wavelength shifters emitting in the 400 to 500 nm range demonstrated a similar relationship between performance and concentration, with about 0.05% (w/w) being an optimum concentration for at least some applications.

Incorporating bis[2-(4,6-difluorophenyl)pyridinato-C2, N](picolinato) iridium(III) (Flrpic) in a mixed organic glass provided high scintillation light yields at $Ir^{3+}$ concentrations as low as 0.03 wt %, as shown in the Examples herein. The highest light yields were achieved at 0.13-0.28 wt % $Ir^{3+}$, yielding 1.8 to 2 times the scintillation light output relative to stilbene. The increase in light yield at such a low $Ir^{3+}$ concentration was a surprising discovery in its own right as one of the most sensitive radioluminescent organic materials known.

A breakthrough in the scintillation light yields of the glass materials disclosed herein was observed. The mixed glass materials of the present application demonstrated to have even higher capabilities of the individually selected symmetric materials described above, which were shown to exceed 1.5 times that of crystalline trans-stilbene. In an embodiment, radioluminescent light yields may be rather high, such as, for example, 10,000 to 25,000 photons/MeVee, exceeding 16,000 photons/MeVee, such as 17,000 to 24,000, or 18,000 to 22,000 as evaluated against EJ-200 plastic scintillators and solution-grown trans-stilbene crystals. Trans-stilbene is one of the brightest known organic scintillators but is difficult to grow in large sizes and is consequently high-cost. The materials disclosed herein provides greater scintillation light yields than trans-stilbene while enabling the potential for rapid, low-cost, and large-scale production via a simple melt casting process.

Figure 11:
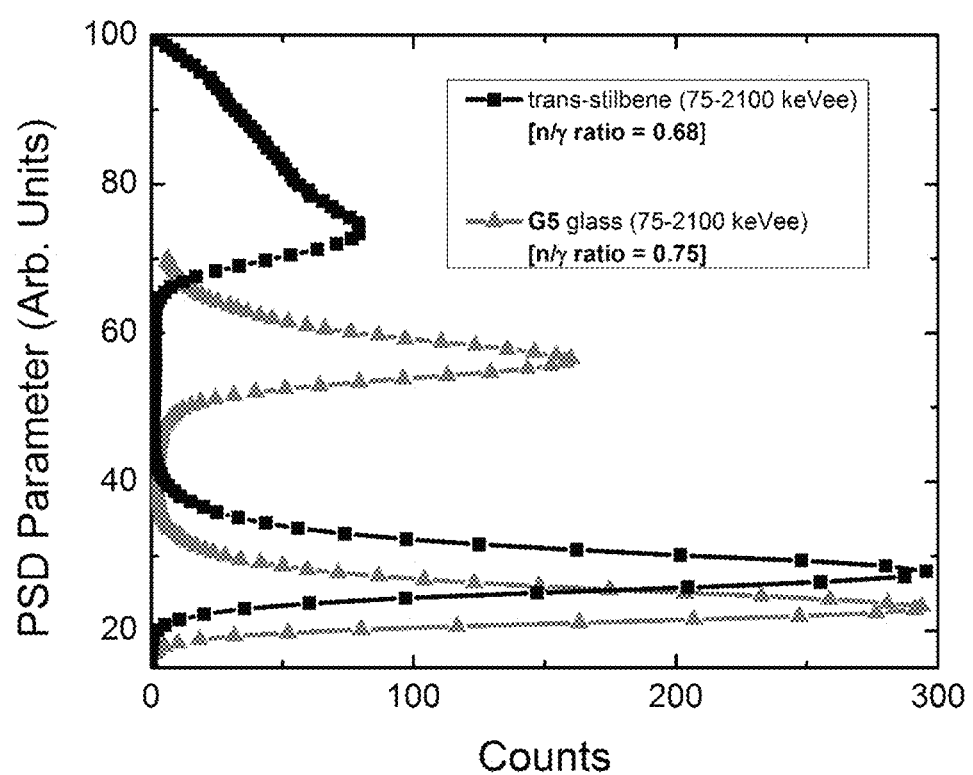
FIG. 11 is a plot of the total integral of neutron and gamma-ray counts in the energy range of 75-2100 keVee for trans-stilbene crystal (black) and G5 glass (gray).

In an embodiment, the mixed glass scintillators have high neutron light yield and are useful for neutron detection. Neutron response is dependent on several factors such as hydrogen content of the material, total light yield (prompt and delayed) and delayed scintillation efficiency. In an embodiment, the mixed glass scintillators have a hydrogen to carbon molar ratio (H:C) of 1.2:0.75, such as 0.9:0.8, or 0.86:0.84. As shown in an example below, in an embodiment the hydrogen to carbon ratio of the mixed glass scintillator is the same as trans-stilbene, 0.857, and the mixed glass scintillator has improved neutron scintillation efficiency over trans-stilbene as measured by the ratio of neutron vs gamma counts (FIG. 11).

In addition, to high scintillation light yields the mixed glass materials described herein are amorphous, robust glass materials that can be sublimated, melt-cast, or formed into large scintillating materials. For example, glass scintillators of sizes on the order of several cubic inches, such as 1 cubic cm to 130,000 cubic cm, such as 25 cubic cm to 5000 cubic cm, or 30 cubic cm to 200 cubic cm can be manufactured according to the procedures disclosed herein. In an embodiment, the glass scintillators have thicknesses of 1 micrometer to 1 meter, such as, for example, 10 micrometers to 100 centimeters, or 1 centimeter to 10 centimeters. It is believed that small-molecule-based organic glasses have never been implemented by others in large scale applications, such as greater than about 1 $cm^3$.

In addition, the prepared organic glasses exhibit neutron/gamma pulse-shape discrimination (PSD) and are compatible with additives such as wavelength shifters, triplet harvesting dopants, and organometallics.

In an embodiment, the mixed glass material has a Tg of 25° C. to 300° C., 45° C. to 150° C., or 70° C. to 125° C. The material is not a liquid at room temperature (23° C.). In an embodiment, the material does not behave anisotropically with light. In an embodiment, the material is non-scattering or non-absorbing of light. Furthermore, in an embodiment of the mixed glass materials, under powder X-ray diffraction (PXRD) no discrete X-ray reflections are observed.

In an embodiment, the mixed glass compounds may have a number average molecular weight of 100 to 2,500 g/mol, such as 500 to 2,200 g/mol, or 800 g/mol to 1,800 g/mol. The compound is not polymeric or oligomeric, that is, it is not a reaction product of multiple repeat units. By these metrics, among others, the glass compound differs from plastic-type scintillators.

In an embodiment, the mixed glass compounds also possess improved fast scintillation times. As shown in the examples, as compared to trans-stilbene and commercial reference materials, the mixed glass samples possess faster scintillation rise-time and decay characteristics. This is promising for applications such as active interrogation that demand fast counting as well as neutron discrimination.

In an embodiment, the mixed glass material has improved resistance to recrystallization over any of the separate pure compounds. In an embodiment the mixed glass material is fully amorphous for at least two weeks, such as at least 1 month, or 3 weeks to 3 months from the time of synthesis under accelerated aging conditions of 80° C. at standard pressure of 1 atm, and a relative humidity range not exceeding the limits of 20 to 55% (humidity values measured at 23° C.). Standard laboratory humidity is 20 to 55% and values within this range should not appreciably affect the test results to a degree relevant to a person of ordinary skill in the art. To determine whether the material is fully amorphous, a 200 mg sample is visually observed through a jeweler's loupe to determine if it is fully transparent, i.e., no cloudiness.

The developed materials may be applied to applications that require high luminosity, high electron/hole mobilities, and stable film-forming properties. Two such examples include the fields of organic light emitting diodes (OLEDS) and organic photovoltaics (OPV). The material may be incorporated into a photomultiplier tube. More generally, the materials may also be used in detectors for radioactive and nuclear materials, including mobile detectors for use outside the laboratory in the field.

The organic glass components of the glass mixture may be prepared by standard organic synthesis techniques. For example, the luminescent organic groups may be functionalized, e.g., lithiated with an alkyl lithium reagent and reacted in solution with the central atom or moiety. The resulting crystals can be purified by flash column chromatography, recrystallization, and/or sublimation.

The purified powder product may be dissolved and mixed with the second or additional organic glass components. The mixture in solution may be concentrated in vacuo so that it forms a solid. Then the mixture is melted, optionally with additives (such as wavelength shifters) dispersed therein, and then cast in a mold and cooled, or drop cast and cooled. The additives may be dispersed by adding them in solution to the material, which may be in a dissolved, powder or crystalline form, prior to melting.

Alternatively, the organic glass compounds may be separately melted and then mixed in a melted state, or melted together in powder form prior to mixing and then mixed.

In an embodiment, the melted material is slowly cooled in a controlled environment. The environment may be heated to gradually cool the material to the solid state, for example, control the cooling of the material at a rate of 1 degrees to 10 degrees C. per minute, such as, for example, 2 to 8 degrees C. per minute, or 3 to 6 degrees C. per minute. This gradual cooling method improves the mixed compound glass scintillator's physical stability, reducing brittleness of the material.

The sublimation method provides the hardest material, and is likely the purest. There is less stress built into the glass structure with this method. However, it should be performed in a vacuum chamber and it is more difficult to achieve glass structures of larger sizes and manufacture them in this method on a large scale compared to the melt forming or drop-casting method.

EXAMPLES

Examples 1 to 20 are examples of luminescent glass compounds that may be used as components in the mixed compound glass scintillators of the present application. Examples 21 to 31 are examples of the mixed compound glass scintillators and analysis of the same.

Examples 1 to 3

The procedure for synthesizing Examples 1 to 3 was as follows. 2-bromo-9,9-dimethylfluorene was prepared according to a known procedure (*J. Phys. Chem. Lett.* 2010, 1, 616-620). A dry 500 mL round bottom flask was charged with a stir bar, 2-bromo-9,9-dimethylfluorene (21.85 g, 79.99 mmol, 3.0 equiv) and THF (180 mL) under argon. The mixture was cooled to −78° C., followed by addition of t-BuLi as 1.7 M solution in n-pentane (100 mL, 6.4 equiv) via cannula transfer over 10 minutes. A dark brown slurry formed. The mixture was stirred for 15 minutes, followed by the addition of MeSiCl$_3$ (3.13 mL, 26.66 mmol) dropwise via syringe. The mixture was slowly warmed to 25° C. and stirred for 12 hours. H$_2$O (100 mL) was added, and the biphasic mixture was extracted with dichloromethane (DCM) (3×50 mL). The combined organics were washed with brine (30 mL), dried with MgSO$_4$, and concentrated in vacuo. The crude was purified via flash column chromatography (0 to 10% DCM in hexanes) followed by recrystallization from toluene to provide 13.2 g of Example 1 as a colorless crystalline solid (79% yield). Examples 2 and 3 were also made according to this method.

Scheme 1 shows the general procedure for the synthesis of Examples 1 to 3. This procedure formed (tris(9,9-dimethyl-9H-fluoren-2-yl)(methyl)silane) (Example 1), (tris(9,9-diethyl-9H-fluoren-2-yl)(methyl)silane) (Example 2), and (tris(9,9-dipropyl-9H-fluoren-2-yl)(methyl)silane) (Example 3).

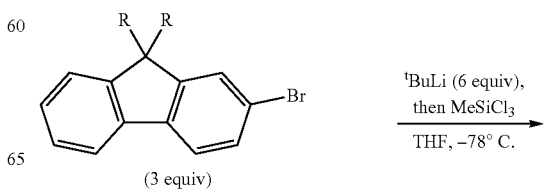

-continued

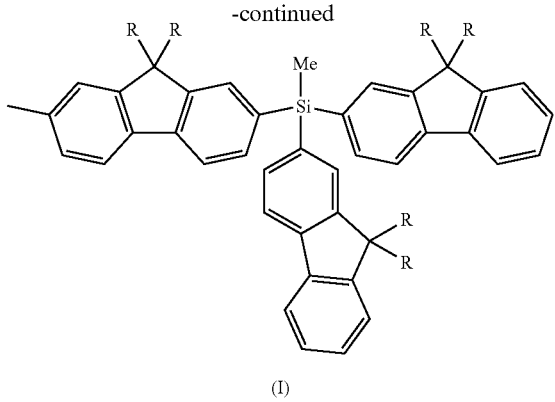

(I)

1 R = Me
2 R = Et
3 R = ⁿPr

Other information on these materials may be found in Carlson, J. and Feng, P., "Melt-Cast Organic Glasses as High-Efficiency Fast Neutron Scintillators" *Nuclear Instruments and Methods in Physics Research A* 2016, 832, 152-157, which is incorporated herein by reference.

Example materials 1 to 3 were separately cast as glasses as follows. The compound 1 to 3 was dissolved in solution and was concentrated in vacuo to provide a colorless solid. The solid was placed in a vial and the vial was heated with hot air until the solid completely melted. The liquid was poured onto a clean glass slide and allowed to cool to form a colorless transparent solid.

In addition, additional portions of the compounds of Examples 1 to 3 were also mixed with DPA (0.04 mg), which was added as a solution in DCM, and then cast as a glass as stated above.

Examples 4-7

Examples 4-5 were synthesized following the procedure disclosed for Examples 1B-3B modified with different starting materials. Examples 6 and 7 were prepared in a similar fashion, using either t-butyltrichlorosilane or trichlorophosphine instead of methyltrichlorosilane. The compounds in Examples 4-7 are identified below.

Example 4 (tris(9,9-diisobutyl-9H-fluoren-2-yl)(methyl)silane)

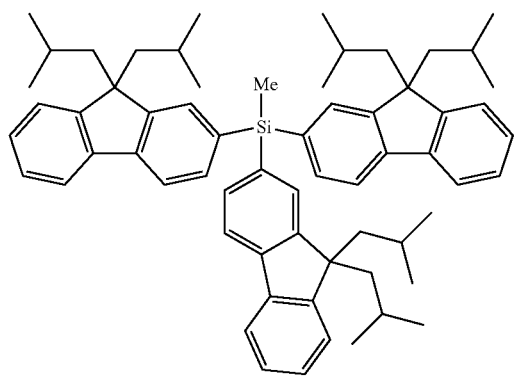 [SMILES: CC(C)CC1(CC(C)C)c2ccccc2-c2ccc([Si](C)(c3ccc4c(c3)C(CC(C)C)(CC(C)C)c3ccccc3-4)c3ccc4c(c3)C(CC(C)C)(CC(C)C)c3ccccc3-4)cc21]

Example 5 (tert-butyltris(9,9-dimethyl-9H-fluoren-2-yl)silane)

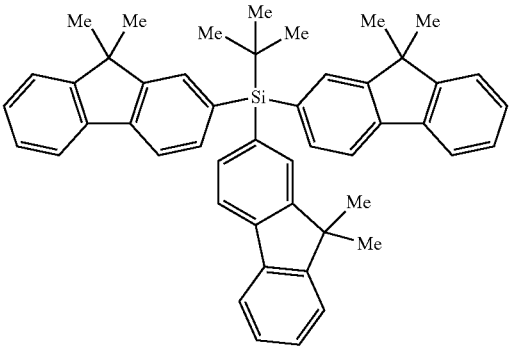 [SMILES: CC1(C)c2ccccc2-c2ccc([Si](c3ccc4c(c3)C(C)(C)c3ccccc3-4)(c3ccc4c(c3)C(C)(C)c3ccccc3-4)C(C)(C)C)cc21]

Example 6 (tert-butyltris(9,9-diethyl-9H-fluoren-2-yl)silane)

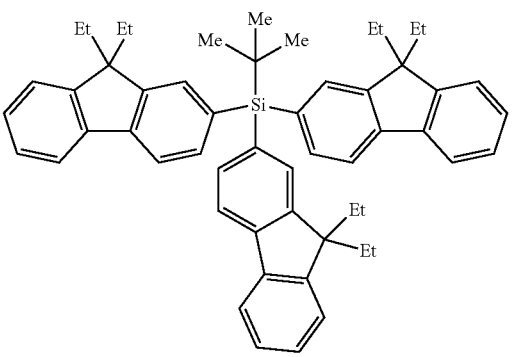 [SMILES: CCC1(CC)c2ccccc2-c2ccc([Si](c3ccc4c(c3)C(CC)(CC)c3ccccc3-4)(c3ccc4c(c3)C(CC)(CC)c3ccccc3-4)C(C)(C)C)cc21]

Example 7
(tris(9,9-diethyl-9H-fluoren-2-yl)phosphine oxide)

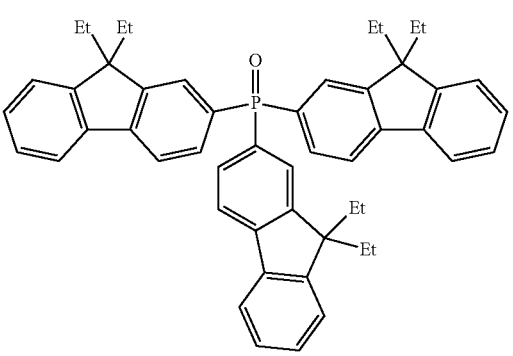 [SMILES: CCC1(CC)c2ccccc2-c2ccc(P(=O)(c3ccc4c(c3)C(CC)(CC)c3ccccc3-4)c3ccc4c(c3)C(CC)(CC)c3ccccc3-4)cc21]

FIGS. 1-4 show DSC traces for Examples 1, 2, 6, and 7, respectively. The increasing line width corresponds to the initial, second, and third heating runs, respectively. Negative peaks represent endothermic transitions (i.e. melting, Tg), whereas positive peaks represent exothermic transitions (i.e. recrystallization). The range of behaviors illustrate the effects that substitution of various atomic positions have upon the observed thermal properties.

The individual glassy nature of Examples 1-7 was quantified by differential scanning calorimetry (DSC), powder X-ray diffraction (pXRD) data, and optical transmission measurements. The absence and/or loss of a melting endotherm in the DSC and the concomitant appearance of a glass transition ($T_g$) endotherm provide evidence for the conversion from a crystalline material to an amorphous glass. This was confirmed using pXRD, for which no discrete X-ray reflections were observed for the amorphous organic glasses.

Furthermore, the amorphous nature of the individual organic glasses was characterized optically, for which the melted glasses showed high optical transparency after cooling. This is associated with the random orientation of molecules in the glass and is a preferred attribute for a scintillator due to the ability to collect and detect (using a photodetector) optical photons generated within the macroscopic volume of the scintillating material. This is in contrast to crystalline materials, which strongly scatter light at grain boundaries upon recrystallization from the melt and cannot be used as bulk detectors except in single crystalline form.

Examples 8-20

Representative trigonal pyramidal or tetrahedral structures that may be used as individual components for the mixed compound glass scintillators are shown below. Many of these examples exhibit high resistance towards crystallization. All of the structures below were made and evaluated for their scintillation performance and separately formed a glass material.

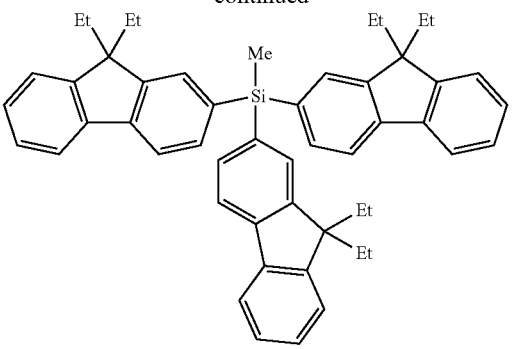

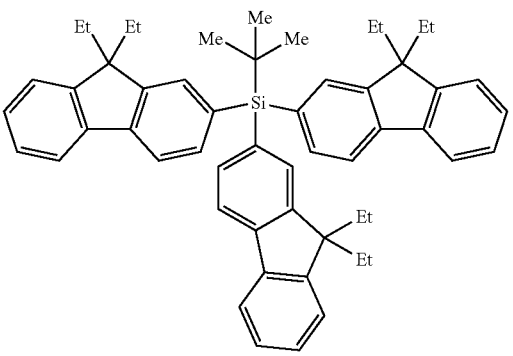

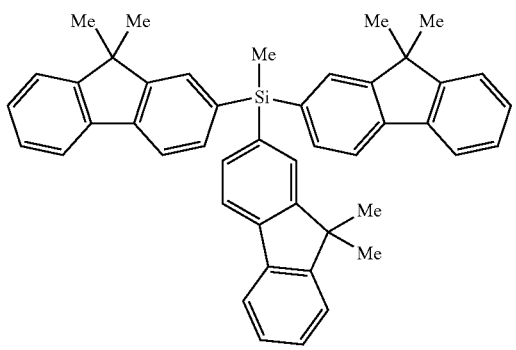

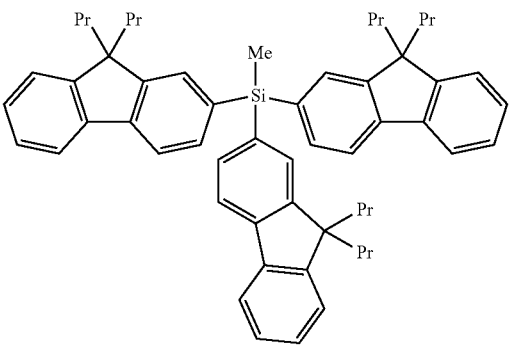

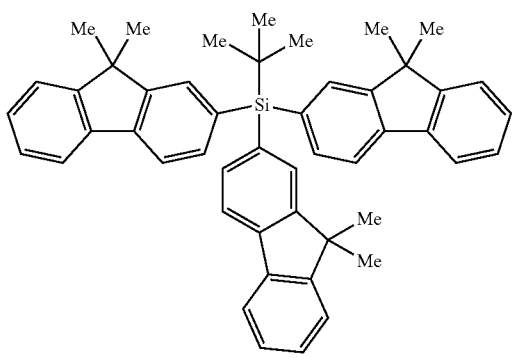

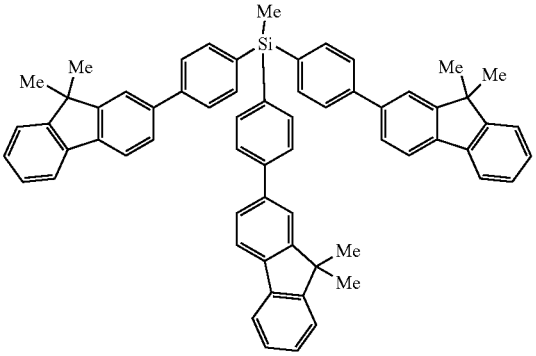

-continued

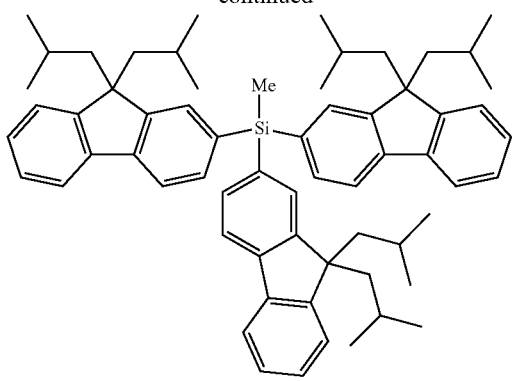

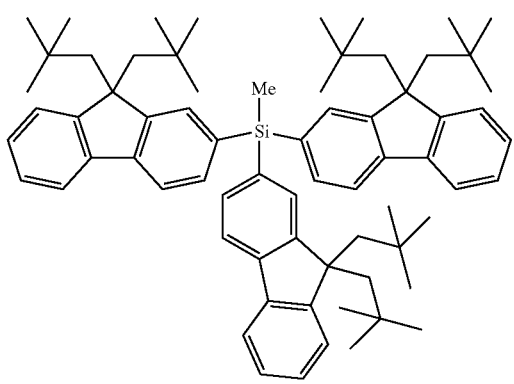

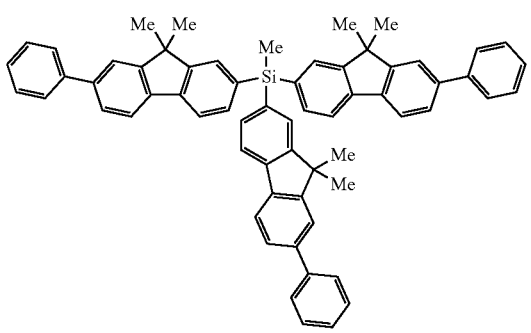

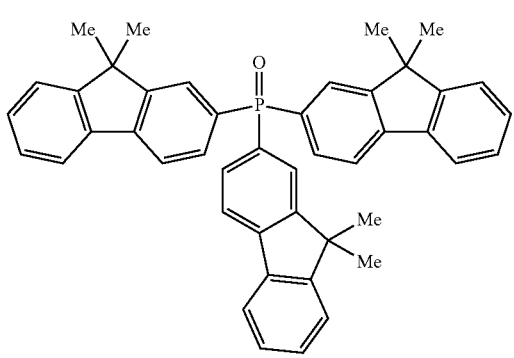

-continued

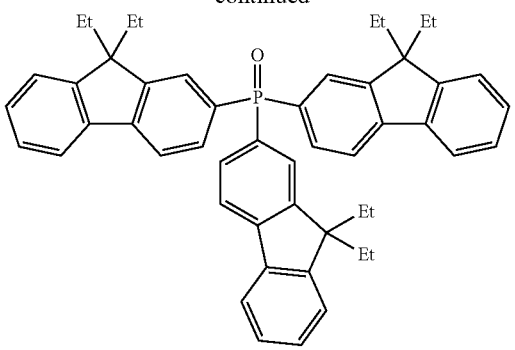

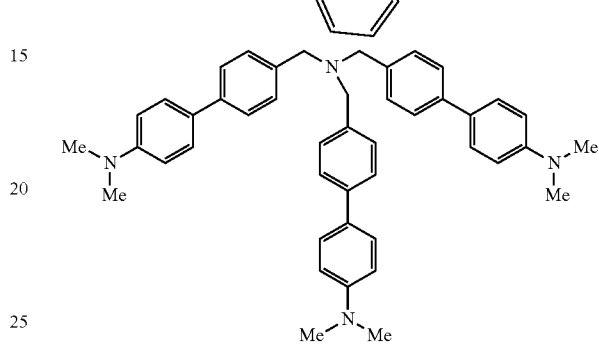

Examples 21 and 22: Compounds 4 and 5

Compound 4 and Compound 5 shown below were synthesized as follows.

A 1 liter round bottom flask was charged with 9,9-dimethylfluorene (25.0 g, 91.5 mmol, 2.5 equiv) and THF (180 mL), then cooled to −78° C. "BuLi (32.2 mL of 2.5 M solution in hexanes, 80.5 mmol, 2.2 equiv) was added via cannula over the course of 10 minutes. A white precipitate was observed forming in solution. After stirring for 1 hour, Ph$_2$SiCl$_2$ (diphenyldichlorosilane) (7.70 mL, 36.6 mmol) was added dropwise via syringe. The precipitate dissipated upon addition, providing a yellow solution. The mixture was allowed to warm to room temperature over the course of an hour and continued to stir overnight. Water (150 mL) was added in one portion and the aqueous phase was extracted with DCM (3×60 mL). The combined organics were washed with brine (1×50 mL), dried with MgSO$_4$, and concentrated in vacuo to provide a yellow residue. Purification via flash column chromatography (SiO$_2$, 0 to 10% DCM in Hexanes) provided 6.85 g of compound 4 as colorless crystals (63% yield).

Compound 5 was prepared in similar fashion and scale except using PhSiCl$_3$ (phenyltrichlorosilane) instead of Ph$_2$SiCl$_2$, with a modified stoichiometry of 9,9-dimethylfluorene (3.5 equiv) and "BuLi (3.1 equiv).

4

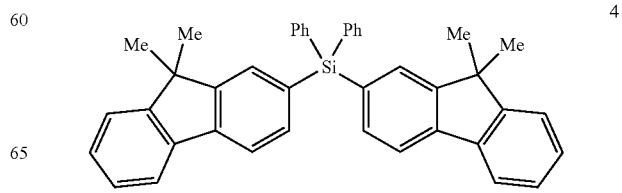

-continued

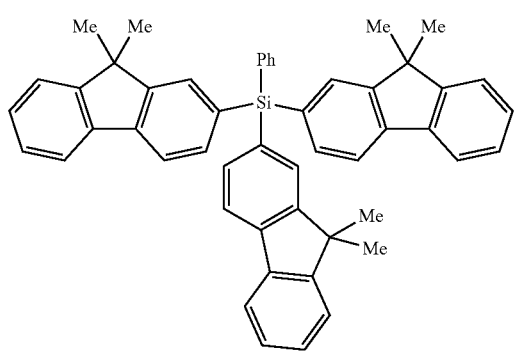

Figure 5:
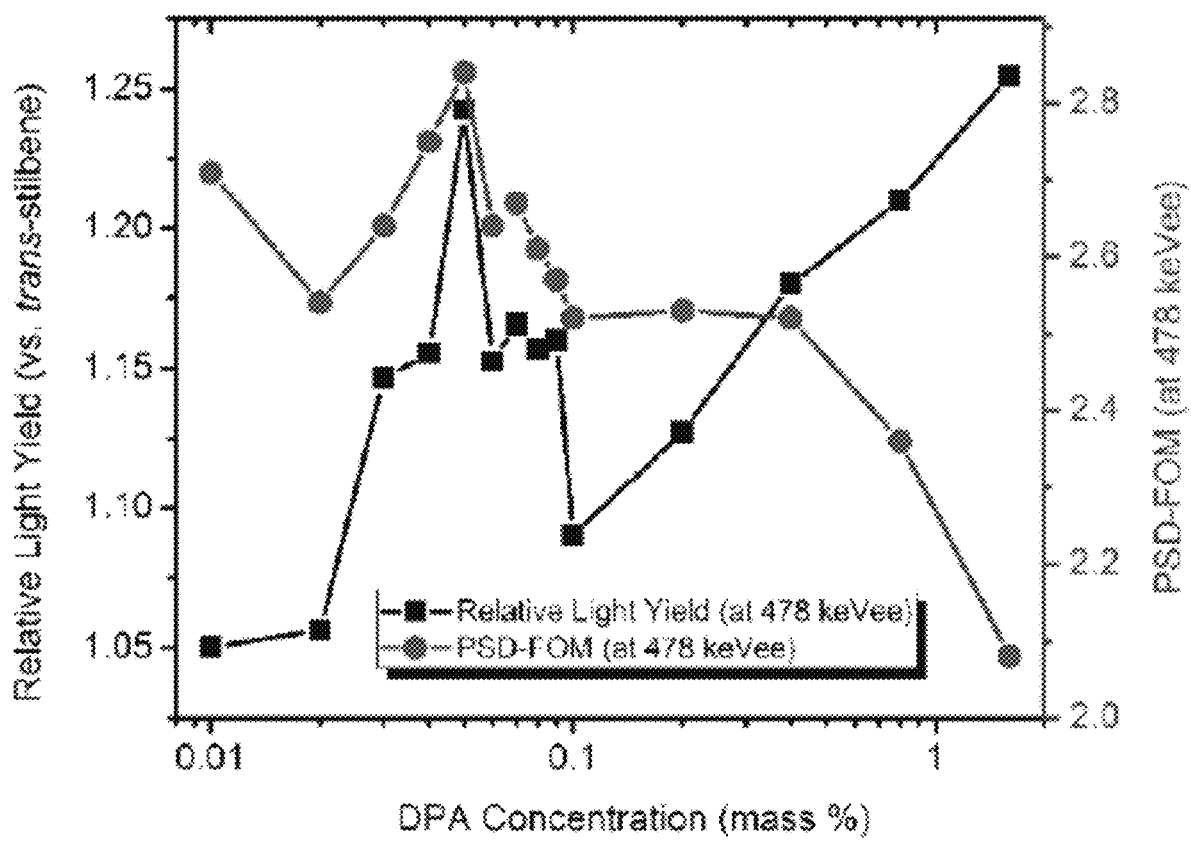
FIG. 5 is a plot showing DPA doping concentration vs light yield and PSD in glass samples of compound 4.

The compound 4 glass was assessed for radioluminescence and showed excellent light yield and PSD. See FIG. 5, which is a plot showing DPA doping concentration vs light yield and PSD in glass samples of compound 4. A further improvement in the light yield was made with the incorporation of DPA into the glass. While it was observed that light yield increases in conjunction with DPA concentration, after a threshold concentration, the particle discrimination ability diminished. On the 200 mg samples tested, it was determined that the maximum benefit for light yield and PSD was obtained with a DPA concentration of 0.05% (w/w), outperforming trans-stilbene in both respects.

Example 23: Mixed Compound Glass Scintillator

The mixed compound glass scintillators with compounds 4 and 5 were prepared by charging a 5 mL or 20 mL vial with 200 mg or 2.0 g (respectively) of a mixture of 4 and 5, in some cases with a desired wavelength shifter. A representative example for a 90:10 ratio of compound 5: compound 4 containing 0.05% (w/w) MSB would contain 1.8 g of compound 4, 200 mg of compound 5, and 1 mg of MSB added neat or as a solution in toluene. See Table 2 for further information on these compounds.

The vial was placed under high vacuum (<100 mmHg) and brought to the melting point by the application of a heat gun and swirled until completely homogenous. Vacuum was broken to the atmosphere and the liquid was poured into a two-piece aluminum mold (pictured). After allowing the sample to cool (5 min for 200 mg, 20 min for 2.0 gram), the mold was separated from the sample. The sample was undisturbed while cooled. It was found that jostling or premature opening of the mold leads to internal stress that can cause the sample to spontaneously fracture. Internal stress can be observed by placing a sample on a light table in between two linear polarizing filters. For glass samples containing Flrpic triplet wavelength shifter, the sample was flushed with nitrogen before melting.

Example 24: Mixed Compound Glass Scintillator with Ir3+ Dopant

Mixed glass scintillators with Ir3+ dopants were made according to the procedure of Example 23, except the Ir3+ dopant was charged to a vial along with the organic compounds prior to melting. The amounts charged are shown in Table 2.

Examples 25 to 31: Analysis of the Mixed Compound Glass Scintillators

For examples 25 to 31 the following conditions were used.

For the reported light yield measurements, the integral of the baseline subtracted pulse from 10 nanoseconds ahead to 170 nanoseconds after the waveform maximum was used as a proxy for total energy deposited. The waveform maximum was determined as the time during the record at which the derivative of the waveform crossed zero; with linear interpolation to provide subsample resolution.

The conversion from this pulse energy to electron equivalent energy (in keVee) was approximated by finding the pulse energy at which the Compton edge reached 70% of the Compton peak value for a $_{137}$Cs gamma source measurement. (The approximation of the Compton edge at 70% of the peak is a close approximation of the correct energy scale, and typical for organic scintillators: Dietze, G.; Klein, H. Nucl. Instrum. Methods 1982, 193, 549-556.) 478 keVee/ (this pulse energy value) was then used as a linear conversion to the energy scale.

The pulse shape discrimination parameter used in this work was defined as the time between 10% and 90% of the baseline subtracted pulse integral over the entire wave-form record; with linear interpolation to provide subsample resolution. It was found that the use of this PSD parameter eliminates the systematic biases that can be introduced by implementing methods that require knowledge of or optimization for the scintillator pulse shape. Because multiple scintillating materials were compared with varying pulse shapes, more popular methods such as the tail to total ratio were not used so as to not bias their relative performance by any particular time window choice.

In order to characterize the PSD performance of each scintillator, a procedure was developed by which an energy dependent Figure of Merit (FOM) was derived. In this work, the familiar FOM definition was used:

$$FOM(E) = \frac{\mu_n(E) - \mu_\gamma(E)}{(\Gamma_n(E) + \Gamma_\gamma(E))}$$

Where μ stands for the mean of a distribution, Γ stand for the full width at half maximum (FWHM) of a distribution, and the subscripts n and γ refer to the neutron and gamma distributions respectively.

Reference samples of EJ-200 and EJ-301 (commercial scintillators) were obtained from Eljen Technology. The solution-grown trans-stilbene reference sample was purchased from Inrad Optics, Inc.

Example 25: Comparison of Recrystallization of the Glass Scintillator

Compound 4 and the Mixed Compound Glass Scintillator Compound 4 and 5

Figure 6:
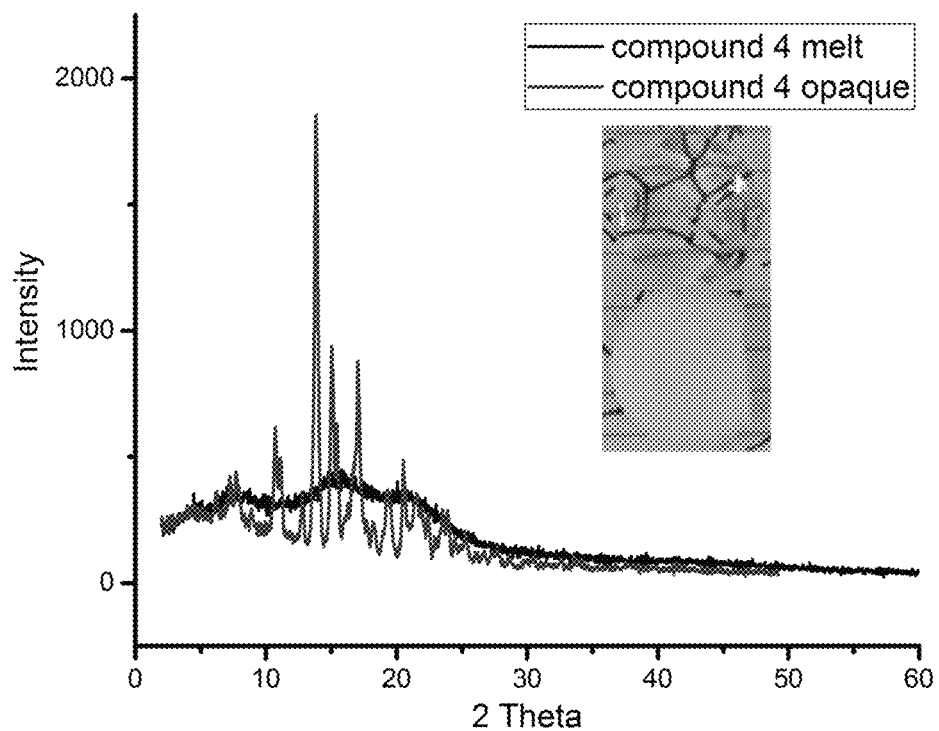
FIG. 6 is a powder XRD plot of compound 4 formed into glass, depicting the change of a 2 gram sample from clear and amorphous to opaque and crystalline over time.

To make an accurate comparison between the mixed compound glass scintillators and the state of the art technology, samples were prepared on similar sizes to a reference material. To this end, a 2-gram glass sample of Compound 4 was prepared to coincide with the size of benchmark materials on hand. After casting the glass and several weeks at room temperature, the sample slowly began to turn opaque on the surface and eventually the entire sample turned opaque, resulting from crystallization that was confirmed by powder X-ray diffraction (XRD). FIG. 6 is a powder XRD plot of compound 4 formed into a 2 gram sample glass, depicting the change from clear and amorphous (black line) to opaque and crystalline (gray line) over time. Delayed crystallization would make organic glasses less desirable for practical use in the field. The observation of a glass transition temperature (Tg) and lack of solid to liquid transition (Tm) after multiple heating and cooling cycles in a DSC experiment is frequently used to qualitatively assess the stability of a glassy material. However, it was apparent that this did not necessarily hold true over long durations due to potential kinetic instability of the glassy state.

In contrast, the mixed compound glass scintillators in various ratios showed improved and indefinite resistance to crystallization, even under accelerated aging conditions (Table 1). Ratios of 90:10 to 30:70 were particularly resistant to recrystallization. In Table 1 all samples were 200 mg glasses. The Tg was determined at the onset of the transition. Transparency was determined by observation aided by a jeweler's loupe.

TABLE 1

| 4:5$^{(w/w)}$ | Tg (° C.) | Average Transparency at 80° C. |
|---|---|---|
| 100:0 | 72.6 | 24 hours |
| 90:10 | 75.2 | >4 weeks |
| 70:30 | 80.2 | >4 weeks |
| 50:50 | 81.0 | >4 weeks |
| 30:70 | 89.4 | >4 weeks |
| 10:90 | 95.1 | 72 hours |
| 0:100 | 98.9 | 24 hours |

Example 26: Large Scale Recrystallization Analysis

Figure 7:
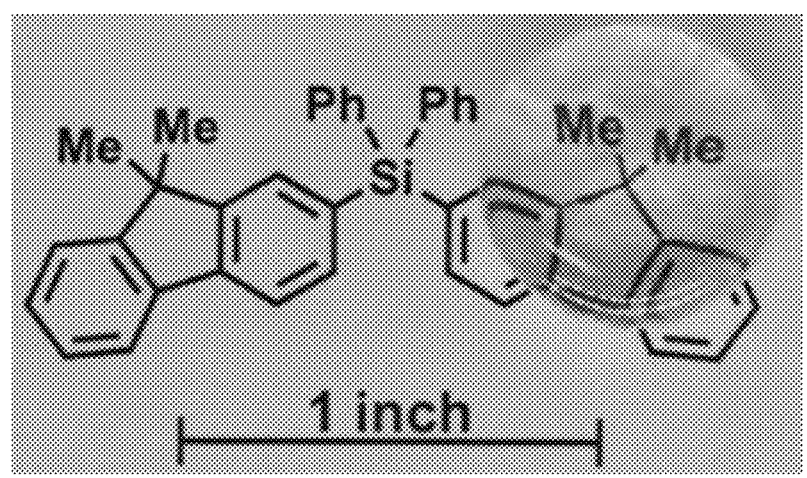
FIG. 7 is a photograph of a 2 gram sample of a mixed compound glass scintillator of compounds 4 and 5 in a 90:10 weight ratio after aging at 60° C. for 72 hours.

In Example 26, a larger scale experiment was conducted with a 2 gram mixed compound glass scintillator of compounds 4 and 5 in a 90:10 weight ratio. The 2 gram material demonstrated the same resistance towards crystallization (as the 200 mg examples) after aging at 60° C. for 72 hours. See FIG. 7, which is a photograph of the 2 gram sample after the aging at 60° C. for 72 hours.

Example 27: Comparative Radioluminescence of Mixed Compound Glass Scintillators

Several glass samples $G_1$ to $G_7$ were formed as 90:10 mixtures of compounds 4 and 5 and synthesized as explained above. These were each 200 mg glass samples. $G_1$ was undoped, while samples $G_2$-$G_8$ were doped with various wavelength shifters and triplet harvesters. Generally, these additives were incorporated into the mixed glass melt by concentrating from solution in vacuo prior to melting.

A trans-stilbene comparative example was analyzed and was formed as a single crystal of similar size (200 mg). Commercial materials EJ-301 and EJ-200 were also tested as comparisons.

Table 2 shows radioluminescence properties of the materials. The fluorescence lifetime was measured at emission maximum. The quantum yield was relative to trans-stilbene, measured at the absorption maximum $Cs_{137}$ relative light yield (478 keVee). PSD-FOM was measured at 478 keVee.

TABLE 2

| Sample | Dopant (w/w) | Lifetime (ns) | QY (Φ) | Light Yield | PSD |
|---|---|---|---|---|---|
| trans-stilbene | — | 2.41 | 1.00 | 1.00 | 3.15 |
| EJ-301 | — | 2.00 (89%) 16.21 (11%) | 0.81 | 0.63 | 2.57 |

TABLE 2-continued

| Sample | Dopant (w/w) | Lifetime (ns) | QY (Φ) | Light Yield | PSD |
|---|---|---|---|---|---|
| EJ-200 | — | 1.50 | 0.95 | 0.63 | 0.66 |
| $G_1$ | — | 1.68 | 1.05 | 0.62 | 2.48 |
| $G_2$ | 0.05% DPA | 8.09 | 0.74 | 1.11 | 2.53 |
| $G_3$ | 0.05% POPOP | 1.52 | 0.92 | 1.11 | 3.56 |
| $G_4$ | 0.05% DPVBi | 1.50 | 1.79 | 0.88 | 3.06 |
| $G_5$ | 0.05% MSB | 1.45 | 1.50 | 1.10 | 3.73 |
| $G_6$ | 0.05% MSB | 1.53 | 1.61 | 1.14 | 3.56 |
| $G_7$ | 1% FIrpic | 1.01 μs | 0.40 | 2.00 | N/A |

Figure 8A:
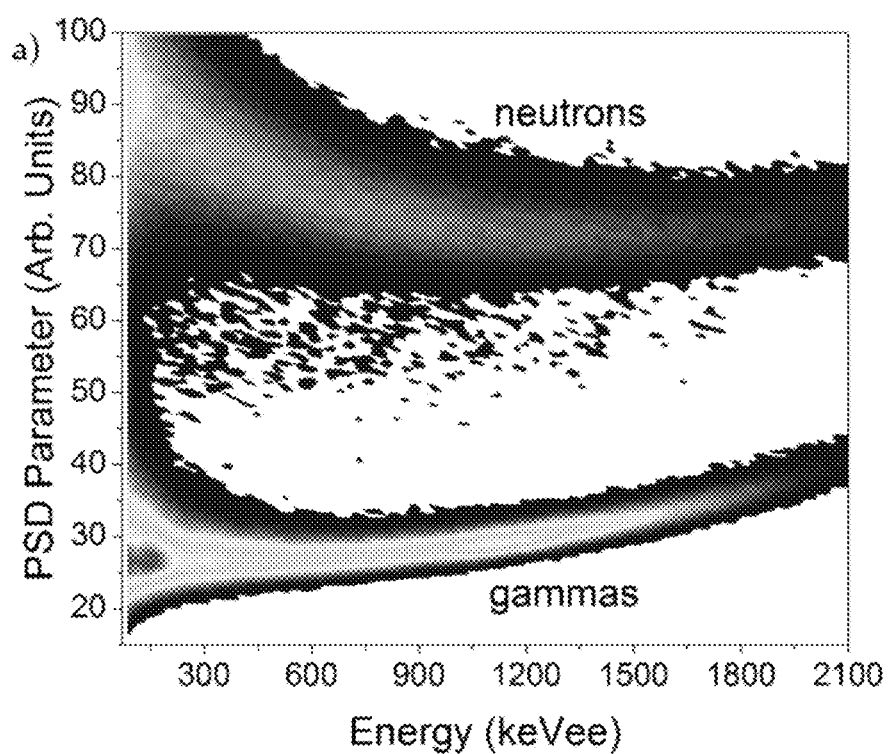
FIGS. 8a and 8b are PSD histograms for a) trans-stilbene crystal and b) $G_5$ glass obtained using an AmBe mixed n/γ-ray source.
Figure 8B:
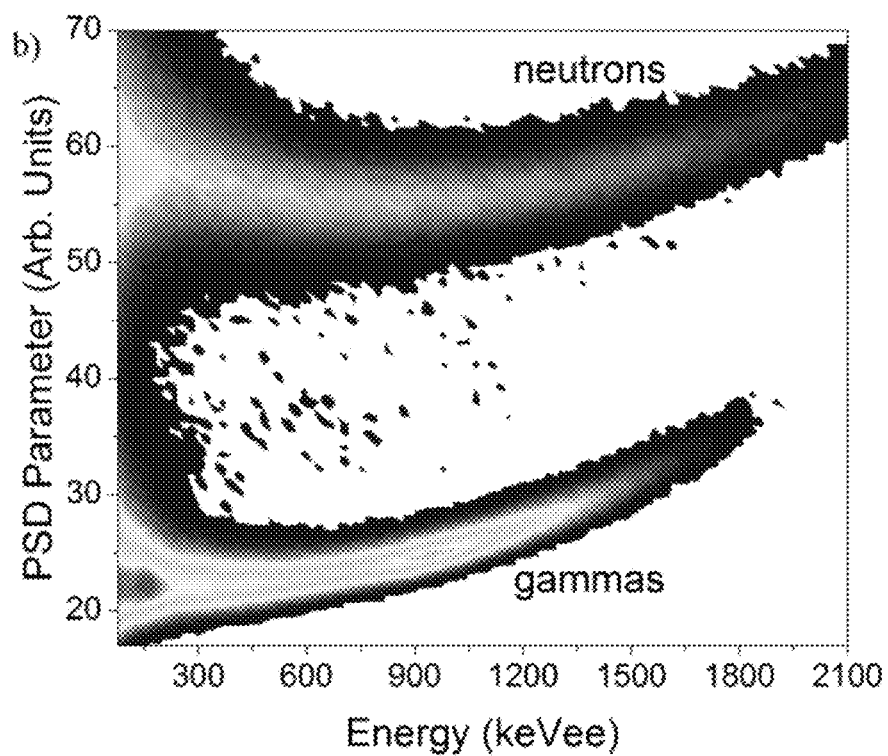
Figure 9:
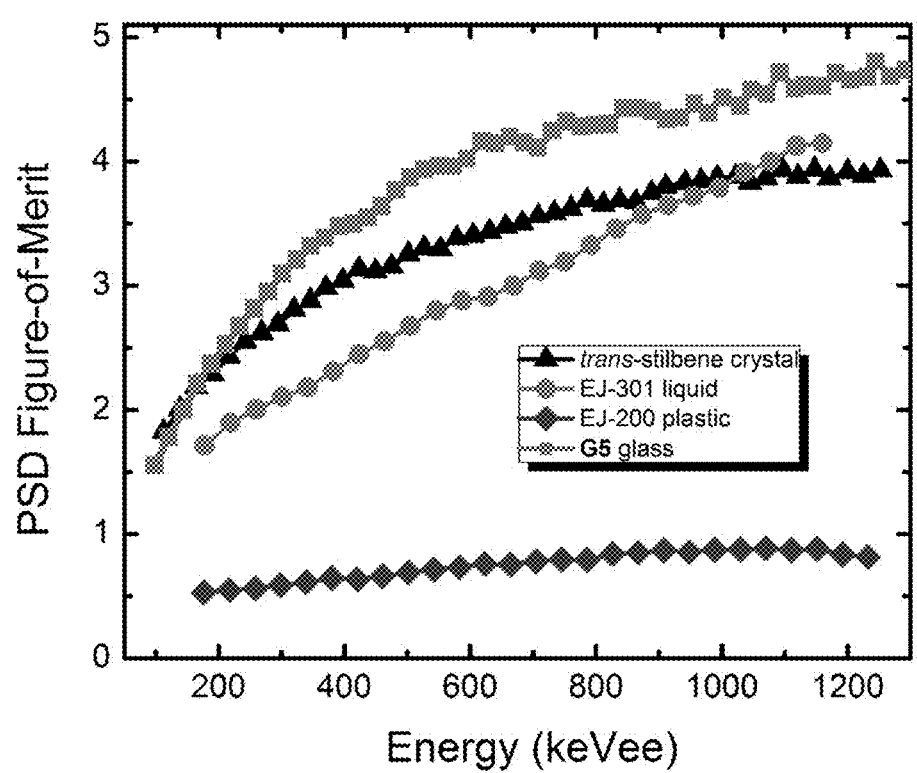
FIG. 9 is a plot of the neutron/gamma pulse-shape discrimination figure-of-merit as a function of gamma-ray energy for $G_5$ glass in comparison to three reference scintillators.

From this data, mixed glass compound $G_5$ was identified as possessing the best performance with 10% greater light yield and 18% greater PSD (pulse shape discrimination). Further analysis of a histogram plot of the data after pulse-processing revealed interesting features. See FIGS. 8a and 8b, which are PSD histograms for a) trans-stilbene crystal and b) G5 glass obtained using an AmBe mixed n/γ-ray source. This data shows that similar to trans-stilbene, there is excellent separation between the neutron and gamma bands down to low energy events, a desirable feature not present in organic liquids and plastics. When the binned histogram data is analyzed using the FOM definition and plotted as a function of energy, it is clear that the PSD capability of $G_5$ outperforms trans-stilbene across the energy range. See FIG. 9, which is a plot of the neutron/gamma pulse-shape discrimination figure-of-merit as a function of gamma-ray energy for $G_5$ glass in comparison to three reference scintillators.

Figure 10:
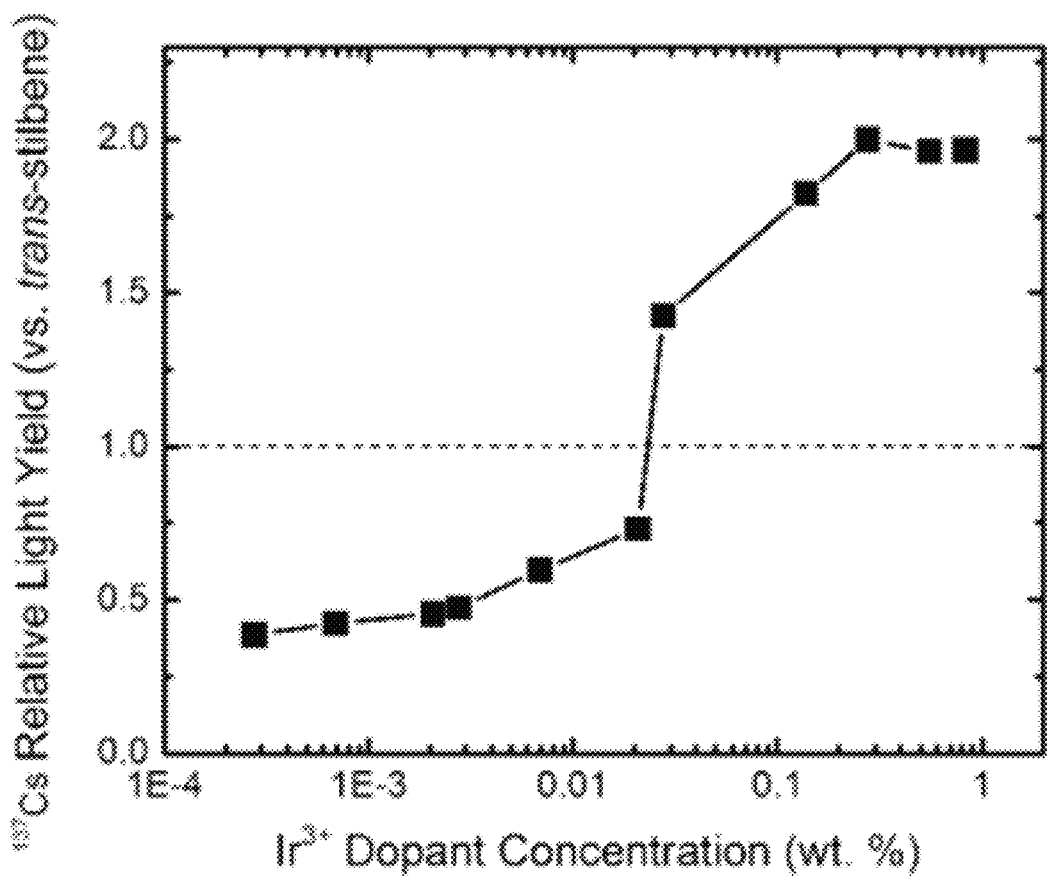
FIG. 10 is a plot of the relative $_{137}$Cs scintillation light yield as a function of $Ir_{3+}$ dopant concentration.

Example 28: Scintillation Yield of $Ir_{3+}$ Doped Mixed Compound Glass Scintillator The $IR_{3+}$ doped glass scintillator of Example 24 was analyzed for its scintillation yield. FIG. 10 shows a plot of the relative $_{137}$Cs scintillation light yield as a function of $Ir_{3+}$ dopant concentration. The glass matrix was a 9:1 mixture of compounds 4:5 ($G_1$) and the $Ir_{3+}$ complex was FIrpic.

The data indicated that incorporating FIrpic in organic glass G1 provided high scintillation light yields at $Ir_{3+}$ concentrations as low as 0.03 wt %. The highest light yields were achieved at 0.13-0.28 wt % $Ir_{3+}$, yielding 1.8-2 times the scintillation light output relative to trans-stilbene. This result indicates efficient triplet harvesting in organic glass matrix $G_1$, as reflected by a light yield that is four times greater and an $Ir_{3+}$ doping level six times smaller than for a poly(9-vinylcarbazole) polymer matrix. The presence of $Ir_{3+}$ confers a long fluorescence lifetime on the order of 1 μs, with pulse shapes possessing a very diminished prompt emission peak.

Example 29: Neutron Light Yield Analysis

The neutron light yield of glass $G_5$ was analyzed in Example 29. Since it is difficult to subject samples to a calibrated neutron energy source, a gamma calibrated PSD plot is typically reported using gamma-ray sources of known energies (i.e. keVee scale units). Often times a scintillator can be formulated to possess a higher PSD-FOM, but at the expense of the neutron sensitivity and light yield. To evaluate neutron sensitivity without utilizing a calibrated neutron source, the counts were integrated from the histogrammed data across the relevant energy region with respect to the PSD parameter for glass G5 and compared it to trans-stilbene under identical conditions (FIG. 11). FIG. 11 is a plot of the total integral of neutron and gamma-ray counts in the energy range of 75-2100 keVee for trans-stilbene crystal (black) and $G_5$ glass (gray).

The larger neutron:gamma integral for $G_5$ revealed that the high PSD-FOM values for $G_5$ does not come at the expense of neutron sensitivity/light yield; in fact, the neutron sensitivity/light yield is higher than trans-stilbene. Since fast neutrons have the highest interaction cross-section with hydrogen atoms, the neutron response is dependent on the hydrogen content of a scintillator. The identical H/C ratios (0.857) for both $G_5$ and trans-stilbene indicate that the improvement in neutron scintillation efficiency is attributed to the scintillation properties and not due to a difference in molecular formula.

Example 30

Figure 12:
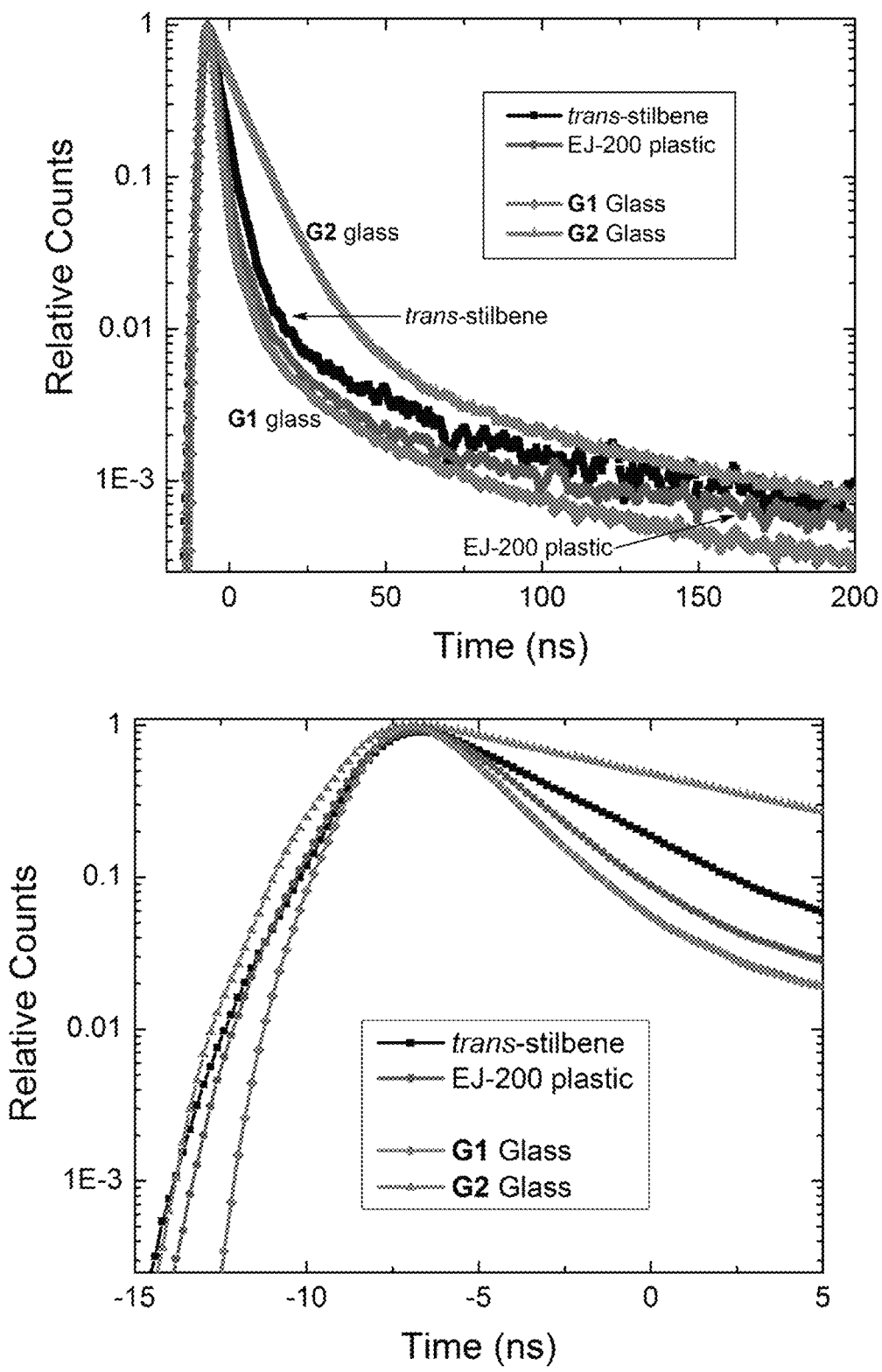
FIG. 12 shows a plot of normalized scintillation timing via time correlated single-photon counting in the presence of a $_{137}$Cs source (top), and a zoomed in region at the pulse max amplitude (bottom).

Fast scintillation timing is also important for a number of radiation detection applications including correlated particle counting and imaging. To demonstrate that the faster fluorescence timing of mixed compound glass scintillator G5 was duplicated in the scintillation response, a time-correlated single-photon counting experiment was used to construct pulse shapes under $_{137}$Cs gamma irradiation (FIG. 12). FIG. 12 shows a plot of normalized scintillation timing via time correlated single-photon counting in the presence of a $_{137}$Cs source (top), and a zoomed in region at the pulse max amplitude (bottom). As compared to trans-stilbene and EJ-200 reference materials, the glass samples possess faster scintillation rise-time and decay characteristics. This is promising for applications such as active interrogation that demand fast counting as well as neutron discrimination.

Example 31

Figure 13:
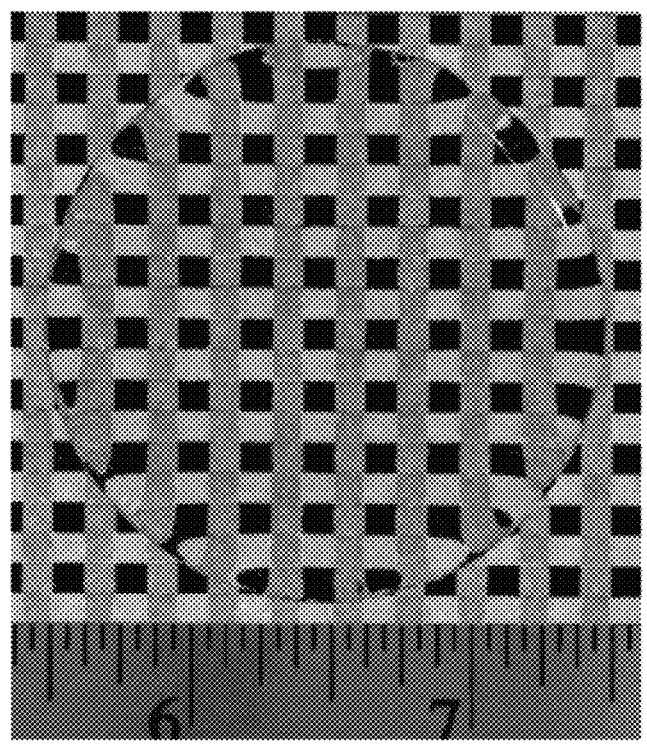
FIG. 13 is a photograph of a 2" diameter, ½" thick casting of $G_1$. (19 grams).

To demonstrate scalability, a casting of mixed compound glass scintillator $G_1$ was made in a size and shape that is compatible with many photomultiplier tubes. The resulting sample possessed very good optical transparency and incurred no damage while handling (FIG. 13). FIG. 13 is a photograph of a 2" diameter, ½" thick casting of $G_1$ (19 grams).

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim. The term "consisting essentially" as used herein means the specified materials or steps and those that do not materially affect the basic and novel characteristics of the material or method. All percentages and averages are by weight unless the context indicates otherwise. If not specified above, the properties mentioned herein may be determined by applicable ASTM standards, or if an ASTM standard does not exist for the property, the most commonly used standard known by those of skill in the art may be used.

The articles "a," "an," and "the," should be interpreted to mean "one or more" unless the context indicates the contrary.

It is claimed:

1. A mixed compound glass scintillator comprising:
   a first compound and a second compound:
   the first compound is organic, has a Tg greater than 25° C., is capable of generating luminescence in the presence of ionizing radiation, and includes:
     a central species selected from the group consisting of: carbon, silicon, and tin;
       a luminescent organic group bonded to the central species or to an optional organic linker group;
     the optional organic linker group, if present, is bonded to the central species and the luminescent organic group;
     the second compound has a Tg greater than 25° C.;
     the first and second compound are mixed and melted to form a glass material.

2. The mixed compound glass scintillator of claim 1, wherein the second compound is capable of generating luminescence in the presence of ionizing radiation, and includes:
   a second central species selected from the group consisting of: carbon, silicon, phosphorus, nitrogen, tin, germanium; an oxide, salt, or alkyl salt of silicon, phosphorus, nitrogen, tin, or germanium; or a rotationally symmetric organic species;
     a second luminescent organic group bonded to the central species or to an optional second organic linker group;
   the optional second organic linker group, if present, is bonded to the second central species and the second luminescent organic group.

3. The mixed compound glass scintillator of claim 2, wherein the central species of the first compound is silicon, and the second compound is a fluorescent organic molecule.

4. The mixed compound glass scintillator of claim 2, wherein the first and second compounds are enantiomers or diastereomers.

5. The mixed compound glass scintillator of claim 2, wherein the first compound absorbs and emits light with a quantum yield that exceeds 0.3 as determined by an integrating sphere at sample method according to NIST standard NISTIR 7458.

6. The mixed compound glass scintillator of claim 2, wherein the mixed compound glass scintillator is fully amorphous for at least 4 weeks at 80° C., 1 atm, and 20% to 55% relative humidity (relative humidity measured at 25° C.).

7. The mixed compound glass scintillator of claim 1, wherein the luminescent organic group is selected from the group consisting of: quaterphenyl, terphenyl, trans-stilbene, naphthalene, anthracene, truxene, triphenylene, 1,3,5-triphenylbenzene, spirobifluorene, fluorene, carbazole, coumarin, anthracene, naphthalene, biphenyl, coumarin, phenyloxazole, phenyloxadiazole, 2,5-diphenyloxazole, 9,9'-dialkylfluorene, 9,9'-diarylfluorene, 2-aryl-9,9'-dialkylfluorene, 2-aryl-9,9'-diarylfluorene, 7-aryl-9,9'-dialkylfluorene, 7-aryl-9,9'-diarylfluorene, 7-alkyl-9,9'-dialkylfluorene, 7-alkyl-9,9'-diarylfluorene, 9,10-diphenylanthracene, 2,5-diphenyl-1,3,4-oxadiazole, p-terphenyl, salicylic acid, and methyl salicylate and analogs thereof.

8. The mixed compound glass scintillator of claim 1, wherein the central species and the luminescent organic group are selected to inhibit pi-pi stacking in the compound and an overall three-dimensional structure of the compound inhibits pi-pi stacking.

9. The mixed compound glass scintillator of claim 1, wherein the central species is silicon, and the luminescent organic group is benzylic functionalized fluorene.

10. The mixed compound glass scintillator of claim 1, wherein the luminescent organic group is a polycyclic group.

11. The mixed compound glass scintillator of claim 1, wherein the central species of the first compound is silicon, and the second compound is a polymer.

12. The mixed compound glass scintillator of claim 1 has a volume of 1 cubic cm to 130000 cubic cms.

13. The mixed compound glass scintillator of claim 1, wherein the scintillator produces a light yield of 12,000 photons/MeVee to 40,000 photons/MeVee with a trans-stilbene reference.

14. The mixed compound glass scintillator of claim 1, further comprising a wavelength shifter.

15. The mixed compound glass scintillator of claim 1, further comprising a quenching additive.

16. The mixed compound glass scintillator of claim 1, further comprising a triplet harvesting dopant at a weight percentage of 0.01% to 1%.

17. A photomultiplier tube or OLED comprising:
a mixed compound glass scintillator including:
a first compound and a second compound:
the first compound is organic, has a Tg greater than 25° C., is capable of generating luminescence in the presence of ionizing radiation, and includes:
a central species selected from the group consisting of: carbon, silicon, and tin;
a luminescent organic group bonded to the central species or to an optional organic linker group;
the optional organic linker group, if present, is bonded to the central species and the luminescent organic group;
the second compound has a Tg greater than 25° C.;
the first and second compound are mixed and melted to form a glass material.

18. A method of making a glass compound, the steps of which comprise:
mixing a first compound and a second compound:
the first compound is organic, has a Tg greater than 25° C., is capable of generating luminescence in the presence of ionizing radiation, and includes:
a central species selected from the group consisting of: carbon, silicon, and tin;
a luminescent organic group bonded to the central species or to an optional organic linker group;
the optional organic linker group, if present, is bonded to the central species and the luminescent organic group;
the second compound has a Tg greater than 25° C.;
melting the first and second compound to form a mixed and melted compound; and
cooling the mixed and melted compound to form a mixed compound glass scintillator.

19. The method of claim 18, wherein the mixed and melted compound is cooled at a rate of 1 to 10 degrees Celsius per minute.

20. The method of claim 18, further comprising adding a wavelength shifter, a triplet harvesting dopant, quencher or any combination of these prior to the cooling step.

* * * * *